US 011152426B2

United States Patent
Hsiao et al.

(10) Patent No.: US 11,152,426 B2
(45) Date of Patent: Oct. 19, 2021

(54) MEMORY DEVICE USING AN ETCH STOP DIELECTRIC LAYER AND METHODS FOR FORMING THE SAME

(71) Applicant: Taiwan Semiconductor Manufacturing Company Limited, Hsinchu (TW)

(72) Inventors: Cheng-Tai Hsiao, Tainan (TW); Yen-Chang Chu, Tainan (TW); Hsun-Chung Kuang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/743,267

(22) Filed: Jan. 15, 2020

(65) Prior Publication Data

US 2021/0217812 A1    Jul. 15, 2021

(51) Int. Cl.
*H01L 27/22* (2006.01)
*H01L 43/02* (2006.01)
(Continued)

(52) U.S. Cl.
CPC .......... *H01L 27/228* (2013.01); *G11C 11/161* (2013.01); *H01F 10/3259* (2013.01);
(Continued)

(58) Field of Classification Search
CPC . H01L 27/228; H01L 23/5226; H01L 23/528; H01L 43/02; H01L 43/12; H01F 10/3259; H01F 41/34; G11C 11/161
(Continued)

(56) References Cited

U.S. PATENT DOCUMENTS

| 10,199,566 B2 | 2/2019 | Oh et al. |
| 10,529,913 B1 | 1/2020 | Chen et al. |

(Continued)

FOREIGN PATENT DOCUMENTS

| DE | 102018122524 A1 | 3/2019 |
| TW | 1629809 B | 7/2018 |
| TW | 1677055 B | 11/2019 |

OTHER PUBLICATIONS

German Patent and Trademark Office, Application No. 102020101299.3 Examination Report dated Jul. 26, 2020, 11 pages.
(Continued)

*Primary Examiner* — Tu-Tu V Ho
(74) *Attorney, Agent, or Firm* — The Marbury Law Group, PLLC

(57) ABSTRACT

Each memory cell in an array includes a vertical stack that comprises a bottom electrode, a memory element, and a top electrode. An etch stop dielectric layer is formed over the array of memory cells. A first dielectric matrix layer is formed over the etch stop dielectric layer. The top surface of the first dielectric matrix layer is raised in a memory array region relative to a logic region due to topography. The first dielectric matrix layer is planarized by performing a chemical mechanical planarization process using top portions of the etch stop dielectric layer. A second dielectric matrix layer is formed over the first dielectric matrix layer. Metallic cell contact structures are formed through the second dielectric matrix layer on a respective subset of the top electrodes over vertically protruding portions of the etch stop dielectric layer that laterally surround the array of vertical stacks.

20 Claims, 18 Drawing Sheets

(51) Int. Cl.
  *H01L 23/528*    (2006.01)
  *H01L 43/12*     (2006.01)
  *G11C 11/16*     (2006.01)
  *H01F 10/32*     (2006.01)
  *H01F 41/34*     (2006.01)
  *H01L 23/522*    (2006.01)
(52) U.S. Cl.
  CPC ........... *H01F 41/34* (2013.01); *H01L 23/528* (2013.01); *H01L 23/5226* (2013.01); *H01L 43/02* (2013.01); *H01L 43/12* (2013.01)
(58) Field of Classification Search
  USPC ........................................................ 257/427
  See application file for complete search history.

(56) References Cited

U.S. PATENT DOCUMENTS

| | | |
|---|---|---|
| 2017/0053967 A1 | 2/2017 | Chuang et al. |
| 2017/0170237 A1 | 6/2017 | Jung |
| 2017/0194557 A1 | 7/2017 | Chuang et al. |
| 2017/0317143 A1* | 11/2017 | Chen .................... H01L 27/2463 |
| 2018/0158728 A1* | 6/2018 | Chu ........................ H01L 43/02 |
| 2018/0374901 A1 | 12/2018 | Chen et al. |
| 2019/0013353 A1 | 1/2019 | Lee et al. |
| 2019/0096461 A1* | 3/2019 | Koike ..................... H01L 43/02 |
| 2019/0130956 A1* | 5/2019 | Muller ................ H01L 29/0673 |
| 2019/0164584 A1 | 5/2019 | Chuang et al. |
| 2019/0165041 A1 | 5/2019 | Chuang et al. |
| 2020/0006638 A1 | 1/2020 | Chen et al. |

OTHER PUBLICATIONS

Taiwan Patent and Trademark Office, Application No. 109117799 Examination Report dated May 25, 2021, 12 pages.

* cited by examiner

MEMORY DEVICE USING AN ETCH STOP DIELECTRIC LAYER AND METHODS FOR FORMING THE SAME

BACKGROUND

The present disclosure is directed to semiconductor devices, and specifically to a semiconductor memory device using an etch stop hard mask layer for contact via structures and methods of forming the same.

Semiconductor memory devices are widely used in modern electronic devices. Some semiconductor memory devices employ memory cells that include a respective vertical stack of a bottom electrode, a memory element, and a top electrode. For example, a magnetic tunnel junction memory device can employ such a vertical stack in which the memory element includes a magnetic tunnel junction. Electrical contact to the top electrodes can be provided employing contact via structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
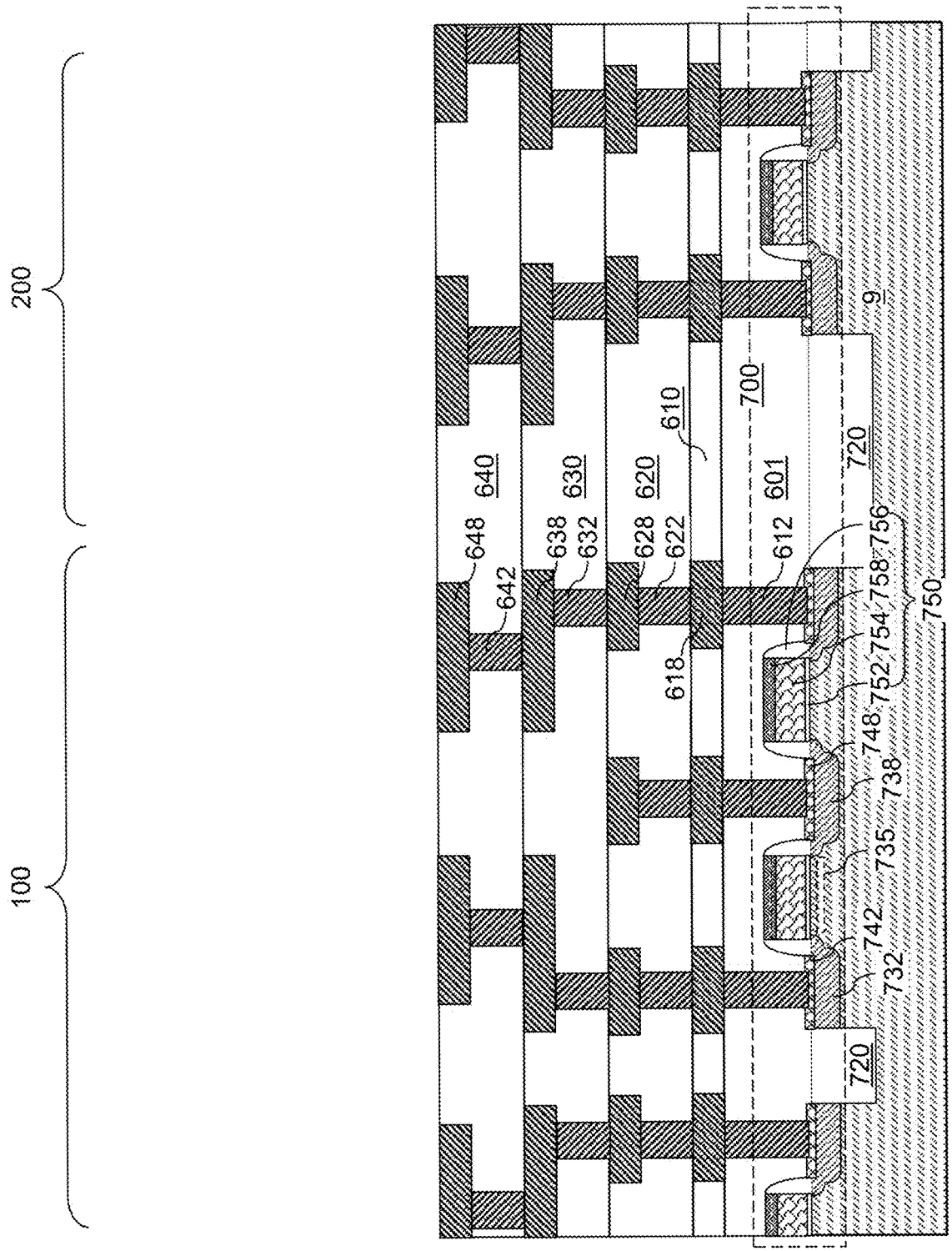
FIG. 1 is a vertical cross-sectional view of an exemplary structure after formation of complementary metal-oxide-semiconductor (CMOS) transistors and metal interconnect structures formed in dielectric material layers according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the structures and methods of the present disclosure can be used for memory devices including an array of memory cells overlying a substrate and located in a memory array region and a logic region located outside the memory array region and is free of memory cells. Each of the memory cells can include a vertical stack containing a bottom electrode, a memory element, and a top electrode. The vertical stacks can be arranged as a one-dimensional array or as a two-dimensional array at a high density that is sufficient to provide topographic average height difference for a dielectric matrix layer to be subsequently formed. However, increasing the density of memory cells introduce additional fabrication concerns. As the lateral dimensions of the memory cells shrink, the process window for formation of contact via structures shrinks. Variations in the height of dielectric matrix layers may result in overetching or underetching of the dielectric matrix layer. For example, an overetch during formation of via cavities for forming the contact via structures can cause electrical shorts (i.e., electrical connection) to underlying material layers. An underetch during formation of the via cavities for forming the contact via structures can cause electrical opens between the top electrodes and the contact via structures.

An etch stop dielectric layer can be formed in conjunction with the array of memory cells prior to formation of the dielectric matrix layer. The etch stop dielectric layer can be used as a planarization stopping material layer during planarization of the dielectric matrix layer. The etch stop dielectric layer can also be subsequently used as an etch stop layer during an anisotropic etch process that forms cell contact cavities for forming contacts to the top electrodes. The memory element within each memory cell can be any type of memory cell having a planar layer structure. While the present disclosure is described using an embodiment in which each memory element includes a magnetic tunnel junction providing magnetoresistance, embodiments are expressly contemplated herein in which the magnetic tunnel junction is replaced with any layer or any layer stack that can provide at least two different states of resistance between the bottom electrode and the top electrode. Therefore, claims of the present disclosure are to be construed to encompass all such variations unless otherwise limited to magnetoresistive memory devices including a respective magnetic tunnel junction.

Further, it is to be understood that the memory devices according to embodiments of the present disclosure may comprise a single discrete memory cell, a one-dimensional array of memory cells, or a two-dimensional array of memory cells. It is also to be understood that a one-dimensional array of memory cells of the present disclosure may be implemented as a periodic one-dimensional array of memory cells, and a two-dimensional array of memory cells of the present disclosure may be implemented as a periodic two-dimensional array of memory cells. In addition, while present disclosure is described using an embodiment in which a two-dimensional array of memory cells is formed within fifth metal interconnect levels, which are commonly referred to as a fifth line-and-via (M5+V4) level, embodiments are expressly contemplated herein in which the two-dimensional array of memory cells is formed within different metal interconnect levels.

Referring to FIG. 1, an exemplary structure according to an embodiment of the present disclosure is illustrated. The exemplary structure includes a substrate 9, which can be a semiconductor substrate such as a commercially available silicon substrate. Shallow trench isolation structures 720 including a dielectric material such as silicon oxide can be formed in an upper portion of the substrate 9. Suitable doped semiconductor wells, such as p-type wells and n-type wells, can be formed within each area that is laterally enclosed by a continuous portion of the shallow trench isolation structures 720. Field effect transistors can be formed over the top surface of the substrate 9. For example, each field effect transistor can include a source region 732, a drain region 738, a semiconductor channel 735 that includes a surface portion of the substrate 9 extending between the source region 732 and the drain region 738, and a gate structure 750. Each gate structure 750 can include a gate dielectric 752, a gate electrode 754, a gate cap dielectric 758, and a dielectric gate spacer 756. A source-side metal-semiconductor alloy region 742 can be formed on each source region 732, and a drain-side metal-semiconductor alloy region 748 can be formed on each drain region 738.

The exemplary structure can include a memory array region 100 in which an array of memory elements is subsequently formed, and a logic region 200 in which logic devices that support operation of the array of memory elements are formed. In one embodiment, devices (such as field effect transistors) in the memory array region 100 can include bottom electrode access transistors that provide access to bottom electrodes of memory cells to be subsequently formed. Top electrode access transistors that provide access to top electrodes of memory cells to be subsequently formed may be formed in the logic region 200 at this processing step. Devices (such as field effect transistors) in the logic region 200 can provide functions that are needed to operate the array of memory cells to be subsequently formed. Specifically, devices in the logic region can be configured to control the programming operation, the erase operation, and the sensing (read) operation of the array of memory cells. For example, the devices in the logic region can include a sensing circuitry and/or a top electrode bias circuitry. The devices formed on the top surface of the substrate 9 may include complementary metal-oxide-semiconductor (CMOS) transistors and optionally additional semiconductor devices (such as resistors, diodes, capacitors, etc.), and are collectively referred to as CMOS circuitry 700.

Various metal interconnect structures formed in dielectric material layers can be subsequently formed over the substrate 9 and the devices (such as field effect transistors). The dielectric material layers can include, for example, a contact-level dielectric material layer 601, a first metal-line-level dielectric material layer 610, a second line-and-via-level dielectric material layer 620, a third line-and-via-level dielectric material layer 630, and a fourth line-and-via-level dielectric material layer 640. The metal interconnect structures can include device contact via structures 612 formed in the contact-level dielectric material layer 601 and contact a respective component of the CMOS circuitry 700, first metal line structures 618 formed in the first metal-line-level dielectric material layer 610, first metal via structures 622 formed in a lower portion of the second line-and-via-level dielectric material layer 620, second metal line structures 628 formed in an upper portion of the second line-and-via-level dielectric material layer 620, second metal via structures 632 formed in a lower portion of the third line-and-via-level dielectric material layer 630, third metal line structures 638 formed in an upper portion of the third line-and-via-level dielectric material layer 630, third metal via structures 642 formed in a lower portion of the fourth line-and-via-level dielectric material layer 640, and fourth metal line structures 648 formed in an upper portion of the fourth line-and-via-level dielectric material layer 640. In one embodiment, the second metal line structures 628 can include source lines that are connected a source-side power supply for an array of memory elements. The voltage provided by the source lines can be applied to the bottom electrodes through the access transistors provided in the memory array region 100.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638, 642, 648) may include at least one conductive material, which can be a combination of a metallic liner layer (such as a metallic nitride or a metallic carbide) and a metallic fill material. Each metallic liner layer can include TiN, TaN, WN, TiC, TaC, and WC, and each metallic fill material portion can include W, Cu, Al, Co, Ru, Mo, Ta, Ti, alloys thereof, and/or combinations thereof. Other suitable materials within the contemplated scope of disclosure may also be used. In one embodiment, the first metal via structures 622 and the second metal line structures 628 can be formed as integrated line and via structures by a dual damascene process, the second metal via structures 632 and the third metal line structures 638 can be formed as integrated line and via structures, and/or the third metal via structures 642 and the fourth metal line structures 648 can be formed as integrated line and via structures. While the present disclosure is described using an embodiment in which an array of memory cells formed over the fourth line-and-via-level dielectric material layer 640, embodiments are expressly contemplated herein in which the array of memory cells may be formed at a different metal interconnect level.

Figure 2:
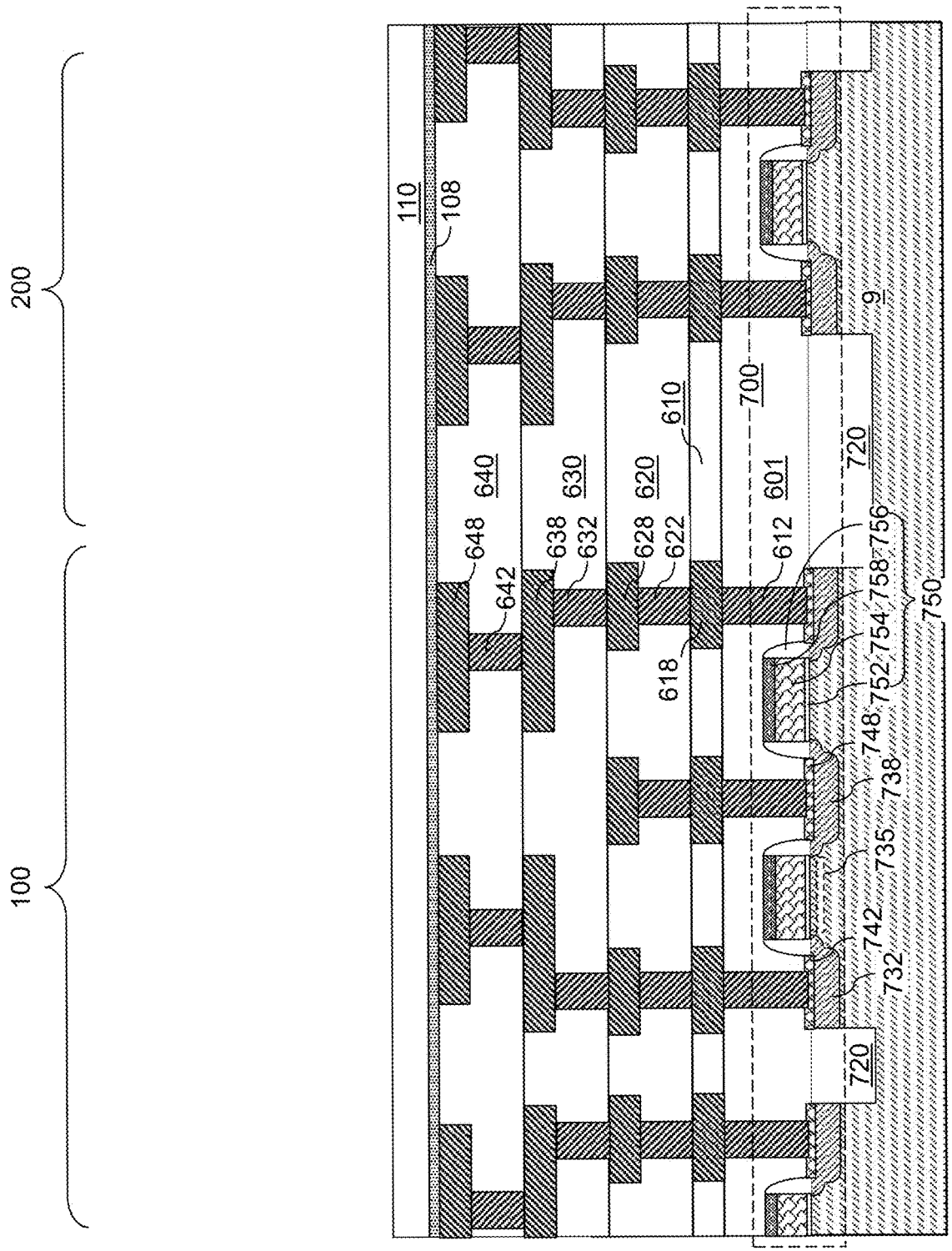
FIG. 2 is a vertical cross-sectional view of the exemplary structure after formation of a dielectric cap layer and a via-level dielectric layer according to an embodiment of the present disclosure.

Referring to FIG. 2, a dielectric cap layer 108 and a via-level dielectric layer 110 can be sequentially formed over the metal interconnect structures and the dielectric material layers. For example, the dielectric cap layer 108 can be formed on the top surfaces of the fourth metal line structures 648 and on the top surface of the fourth line-and-via-level dielectric material layer 640. The dielectric cap layer 108 includes a dielectric capping material that can protect underlying metal interconnect structures such as the fourth metal line structures 648. In one embodiment, the dielectric cap layer 108 can include a material that can provide high etch resistance, i.e., a dielectric material and also may function as an etch stop material during a subsequent anisotropic etch process that etches the via-level dielectric layer 110. For example, the dielectric cap layer 108 can include silicon carbide or silicon nitride, and can have a thickness in a range from 5 nm to 30 nm, although lesser and greater thicknesses can also be used.

The via-level dielectric layer 110 can include any material that may be used for the dielectric material layers (601, 610, 620, 630, 640). For example, the via-level dielectric layer 110 can include undoped silicate glass or a doped silicate glass deposited by decomposition of tetraethylorthosilicate (TEOS). The thickness of the via-level dielectric layer 110 can be in a range from 50 nm to 200 nm, although lesser and greater thicknesses can also be used. The dielectric cap layer 108 and the via-level dielectric layer 110 can be formed as planar blanket (unpatterned) layers having a respective planar top surface and a respective planar bottom surface that extends throughout the memory array region 100 and the logic region 200.

Figure 3:
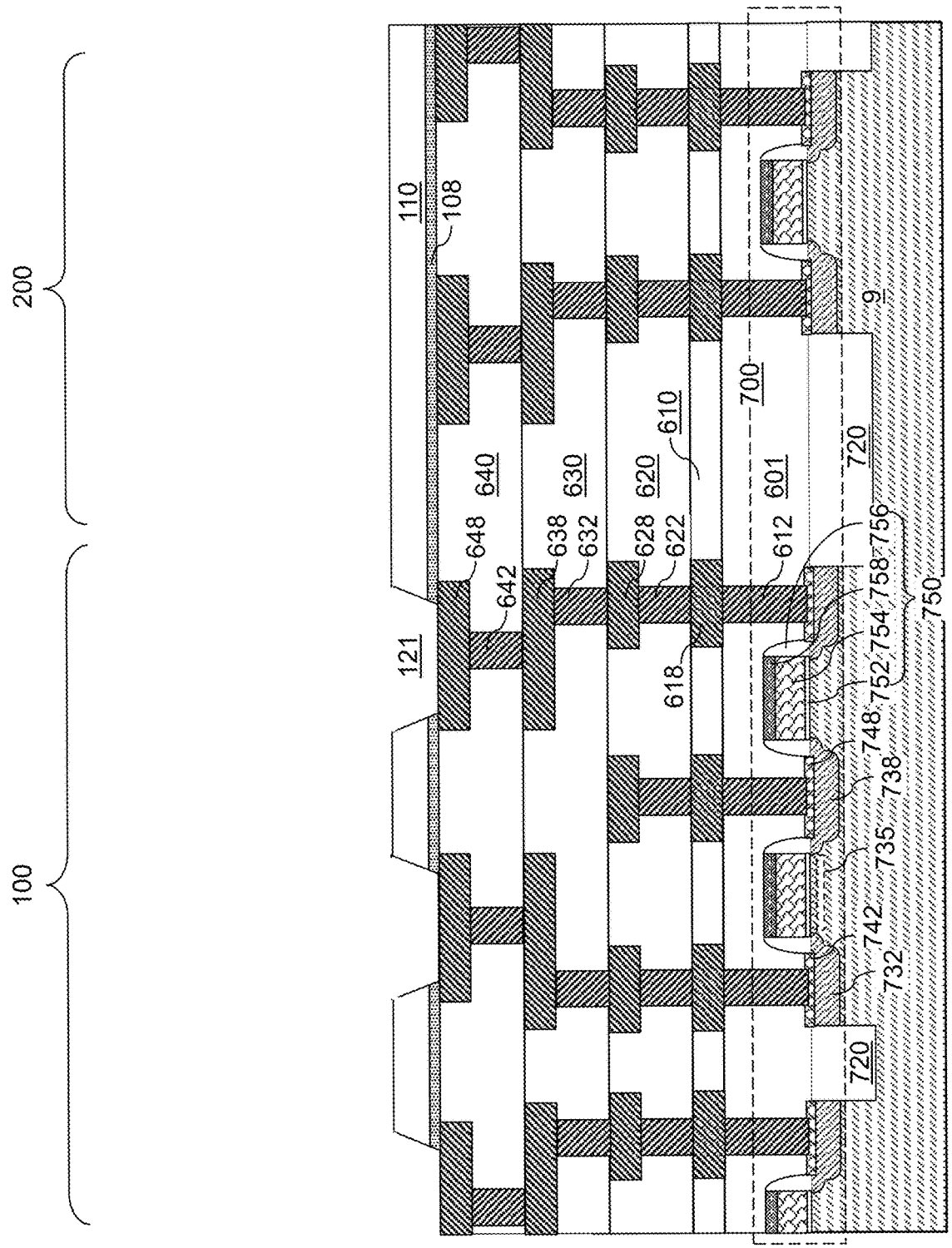
FIG. 3 is a vertical cross-sectional view of the exemplary structure after formation of lower-electrode-contact via cavities according to an embodiment of the present disclosure.

Referring to FIG. 3, via cavities may be formed through the via-level dielectric layer 110 and the dielectric cap layer 108. For example, a photoresist layer (not shown) can be applied over the via-level dielectric layer 110 and can be patterned to form opening within areas of the memory array region 100 that overlie a respective one of the fourth metal line structures 648. An anisotropic etch can be performed to transfer the pattern in the photoresist layer through the through the via-level dielectric layer 110 and the dielectric cap layer 108. The via cavities formed by the anisotropic etch process are herein referred to as lower-electrode-contact via cavities 121 because bottom electrode connection via structures are subsequently formed in the lower-electrode-contact via cavities 121. The lower-electrode-contact via cavities 121 can have tapered sidewalls having a taper angle (within respective to a vertical direction) in a range from 1 degree to 10 degrees. A top surface of a fourth metal line structure 648 can be physically exposed at the bottom of each lower-electrode-contact via cavity 121. The photoresist layer can be subsequently removed, for example, by ashing.

Figure 4:
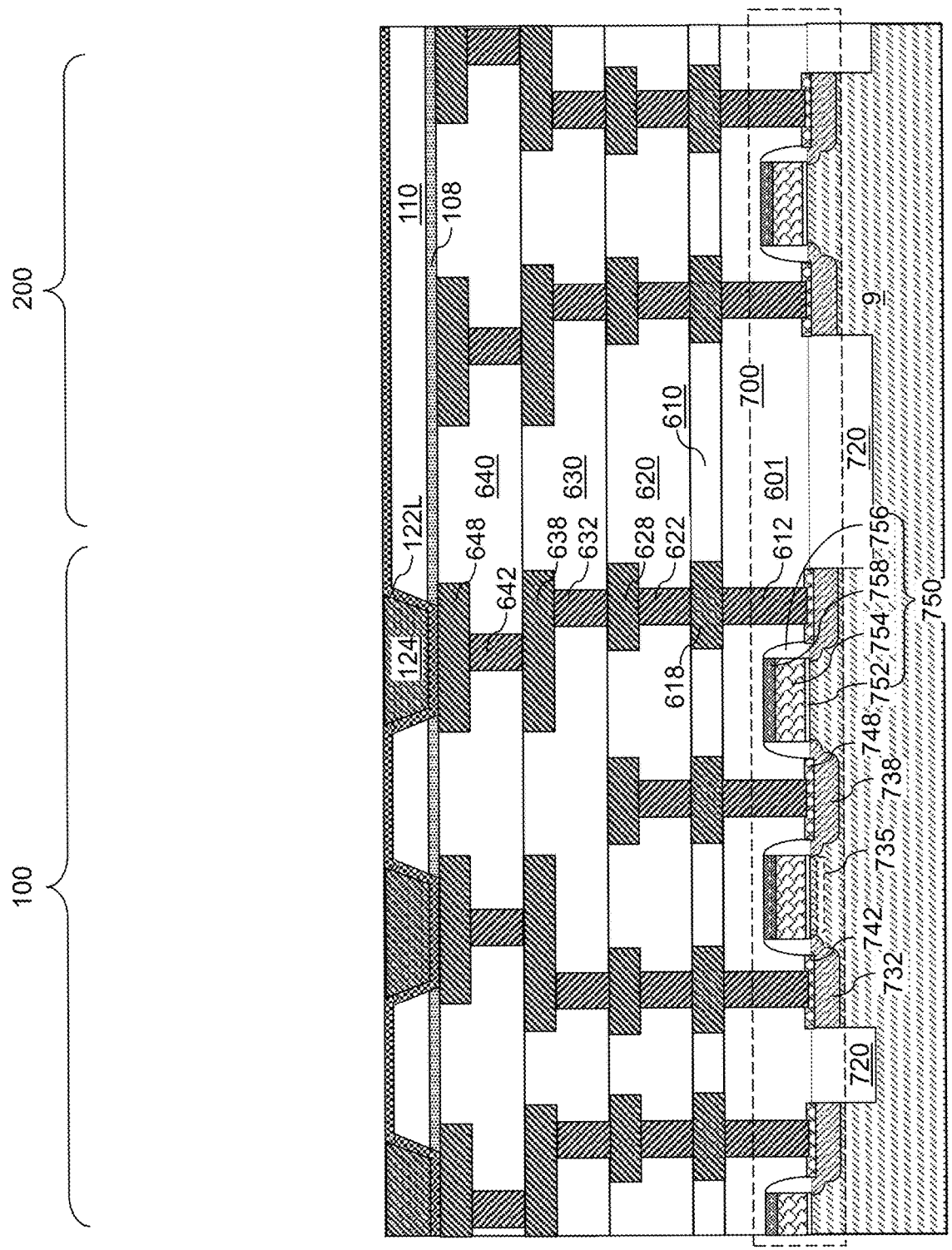
FIG. 4 is a vertical cross-sectional view of the exemplary structure after formation of a continuous metallic barrier layer and metallic via fill material portions according to an embodiment of the present disclosure.

Referring to FIG. 4, a continuous metallic barrier layer 122L can be formed as a continuous material layer. The continuous metallic barrier layer 122L may cover physically exposed top surfaces of the fourth metal line structures 648, tapered sidewalls of the lower-electrode-contact via cavities 121, and the top surface of the via-level dielectric layer 110 without any hole therethrough. The continuous metallic barrier layer 122L can include a conductive metallic nitride such as TiN, TaN, and/or WN. Other suitable materials within the contemplated scope of disclosure may also be used. The thickness of the continuous metallic barrier layer 122L can be in a range from 3 nm to 20 nm, although lesser and greater thicknesses can also be used.

A metallic fill material such as tungsten or copper can be deposited in remaining volumes of the lower-electrode-contact via cavities 121. Portions of the metallic fill material that overlie the horizontal plane including the topmost surface of the continuous metallic barrier layer 122L can be removed by a planarization process such as chemical mechanical planarization to form metallic via fill material portions 124. Each metallic via fill material portion 124 can have a top surface that is coplanar with the topmost surface of the continuous metallic barrier layer 122L.

Figure 5:
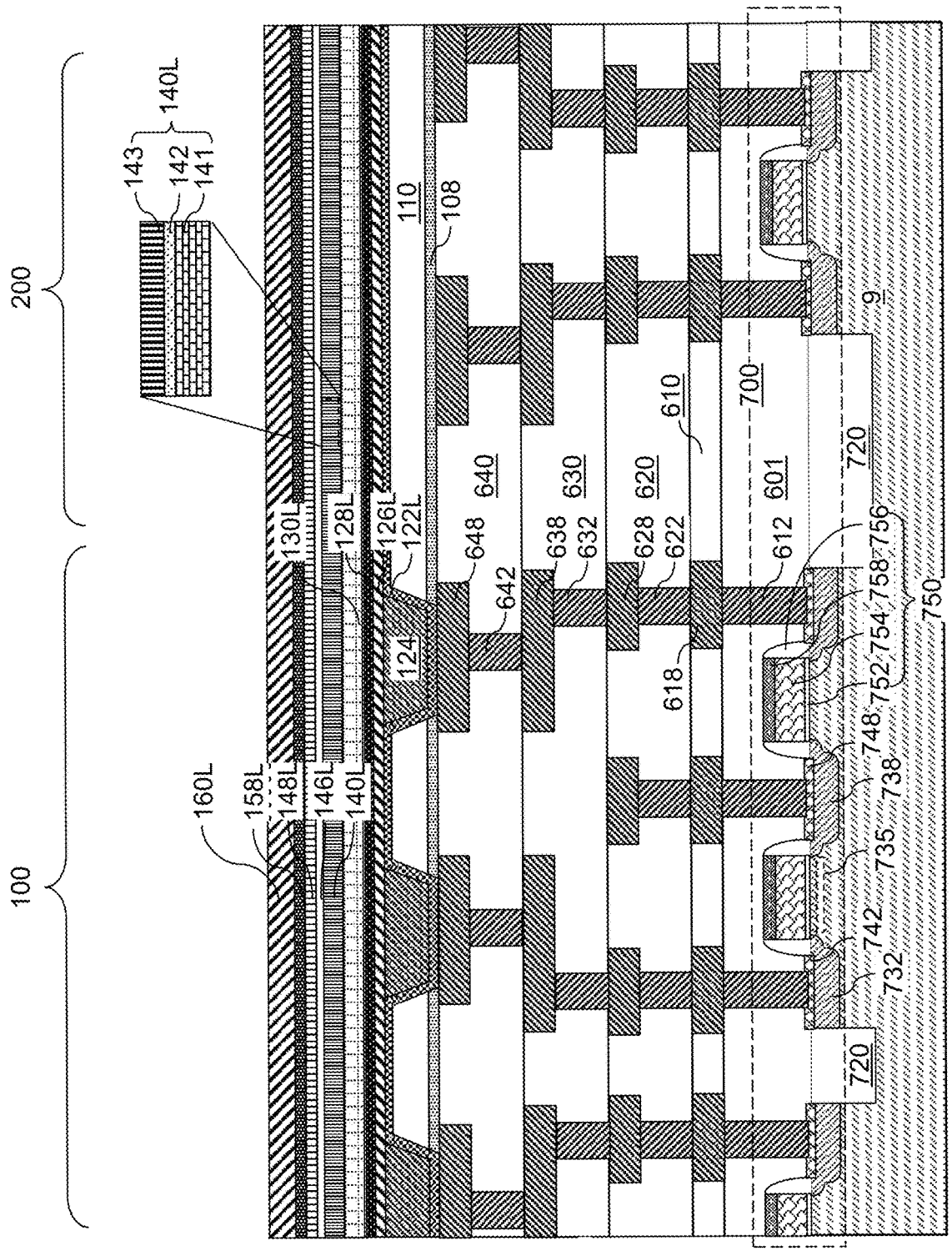
FIG. 5 is a vertical cross-sectional view of the exemplary structure after formation of a continuous bottom electrode material layer, a continuous nonmagnetic metallic buffer layer, a continuous selector material layer, a continuous synthetic antiferromagnet layer, a continuous nonmagnetic tunnel barrier layer, a continuous free magnetization layer, at least one continuous capping layer, and a continuous top electrode material layer according to an embodiment of the present disclosure.

Referring to FIG. 5, a layer stack including a continuous bottom electrode material layer 126L, a continuous nonmagnetic metallic buffer layer 128L, a continuous selector material layer 130L, a continuous synthetic antiferromagnet layer 140L, a continuous nonmagnetic tunnel barrier layer 146L, a continuous free magnetization layer 148L, at least one continuous capping layer 158L, and a continuous top electrode material layer 160L can be formed over the continuous metallic barrier layer 122L and the metallic via fill material portions 124. The layers within the layer stack can be deposited by a respective chemical vapor deposition process or a respective physical vapor deposition process. Each layer within the layer stack can be deposited as planar blanket material layers having a respective uniform thickness throughout.

The continuous bottom electrode material layer 126L includes at least one metallic material such as TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the continuous bottom electrode material layer 126L can include, and/or can consist essentially of, tungsten (W). The thickness of the continuous bottom electrode material layer 126L can be in a range from 10 nm to 100 nm, although lesser and greater thicknesses can also be used.

The continuous nonmagnetic metallic buffer layer 128L includes a nonmagnetic material that may function as a seed layer. Specifically, the continuous nonmagnetic metallic buffer layer 128L can provide a template crystalline structure that aligns polycrystalline grains of the materials of the continuous synthetic antiferromagnet layer 140L along directions that maximizes the magnetization of a reference layer within the continuous synthetic antiferromagnet layer 140L. The continuous nonmagnetic metallic buffer layer 128L can include Ti, a CoFeB alloy, a NiFe alloy, ruthenium, or a combination thereof. The thickness of the continuous nonmagnetic metallic buffer layer 128L can be in a range from 3 nm to 30 nm, although lesser and greater thicknesses can also be used.

The continuous selector material layer 130L includes a selector material, i.e., a material that exhibits a voltage-dependent switch characteristic. The continuous selector material layer 130L can include an oxygen-vacancy-modulated selector material such as hafnium oxide or zirconium oxide, an ovonic threshold switch material such as zinc telluride, or a vertical diode layer stack including a p-doped semiconductor layer and an n-doped semiconductor layer with a horizontal p-n junction therebetween. Alternatively, other materials that turn on under a high voltage bias and turns off under a low voltage bias may be used for the continuous selector material layer 130L.

The continuous synthetic antiferromagnet (SAF) layer 140L can include a layer stack of a ferromagnetic hard layer 141, an antiferromagnetic coupling layer 142, and a reference magnetization layer 143. Each of the ferromagnetic hard layer 141 and the reference magnetization layer 143 can have a respective fixed magnetization direction. The antiferromagnetic coupling layer 142 provides antiferromagnetic coupling between the magnetization of the ferromagnetic hard layer 141 and the magnetization of the reference magnetization layer 143 so that the magnetization direction of the ferromagnetic hard layer 141 and the magnetization direction of the reference magnetization layer 143 remain fixed during operation of the memory cells to be subsequently formed. The ferromagnetic hard layer 141 can include a hard ferromagnetic material such as PtMn, IrMn, RhMn, FeMn, OsMn, etc. The reference magnetization layer 143 can include a hard ferromagnetic material such as Co, CoFe, CoFeB, CoFeTa, NiFe, CoPt, CoFeNi, etc. Other suitable materials within the contemplated scope of disclosure may also be used. The antiferromagnetic coupling layer 142 can include ruthenium or iridium. The thickness of the antiferromagnetic coupling layer 142 can be selected such that the exchange interaction induced by the antiferromagnetic coupling layer 142 stabilizes the relative magnetization directions of the ferromagnetic hard layer 141 and the reference magnetization layer 143 at opposite directions, i.e., in an antiparallel alignment. In one embodiment, the net magnetization of the continuous SAF layer 140L by matching the magnitude of the magnetization of the ferromagnetic hard layer 141 with the magnitude of the magnetization of the reference magnetization layer 143. The thickness of the continuous SAF layer 140L can be in a range from 5 nm to 30 nm, although lesser and greater thicknesses can also be used.

The continuous nonmagnetic tunnel barrier layer 146L can include a tunneling barrier material, which may be an electrically insulating material having a thickness that allows electron tunneling. For example, the continuous nonmagnetic tunnel barrier layer 146L can include magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). Other suitable materials within the contemplated scope of disclosure may also be used. The thickness of the continuous nonmagnetic tunnel barrier layer 146L can be 0.7 nm to 1.3 nm, although lesser and greater thicknesses can also be used.

The continuous free magnetization layer 148L includes a ferromagnetic material having two stable magnetization directions that are parallel or antiparallel to the magnetization direction of the reference magnetization layer 143. The continuous free magnetization layer 148L includes a hard ferromagnetic material such as Co, CoFe, CoFeB, CoFeTa, NiFe, CoPt, CoFeNi, etc. Other suitable materials within the contemplated scope of disclosure may also be used. The thickness of the continuous free magnetization layer 148L may be in a range from 1 nm to 6 nm, although lesser and greater thicknesses can also be used.

The at least one continuous capping layer 158L includes at least one capping material. Exemplary capping materials that may be used for the at least one continuous capping layer 158L include, but are not limited to, a metallic material such as Be, Mg, Al, Ti, Ta, W, Ge, Pt, Ru, Cu, an alloy thereof, and a layer stack thereof. Other suitable materials within the contemplated scope of disclosure may also be used. Additionally, or alternatively, the at least one continuous capping layer 158L may include a conductive metal nitride and/or a conductive metal nitride. The total thickness of the at least one continuous capping layer 158L can be in a range from 0.5 nm to 5 nm, although lesser and greater thicknesses can also be used.

The continuous top electrode material layer 160L includes at least one metallic material such as TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the continuous top electrode material layer 160L can include, and/or can consist essentially of, tungsten (W). The thickness of the continuous top electrode material layer 160L can be in a range from 10 nm to 100 nm, although lesser and greater thicknesses can also be used.

Figure 6:
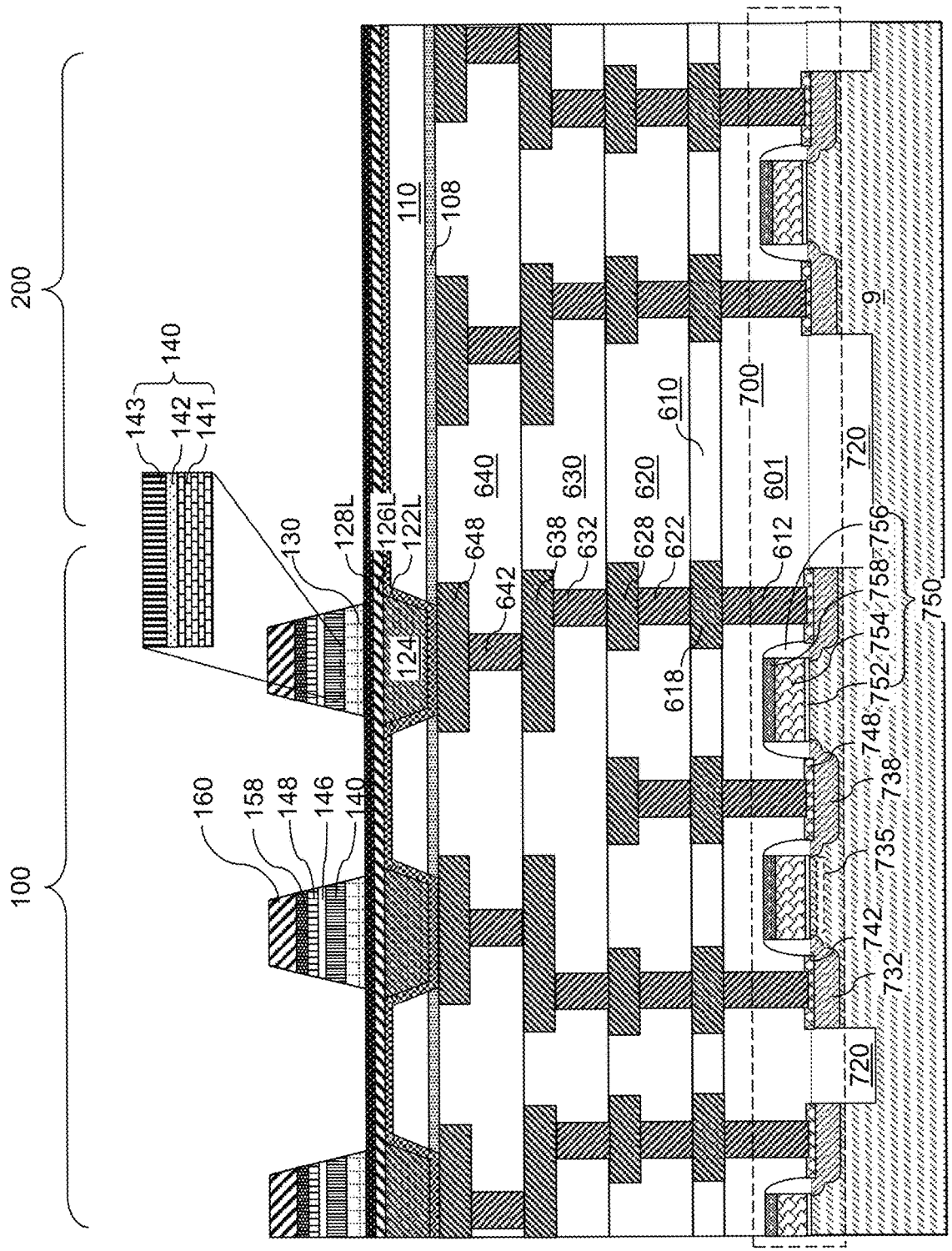
FIG. 6 is a vertical cross-sectional view of the exemplary structure after formation of an array of discrete vertical stacks, each including a selector element, a synthetic antiferromagnet structure, a nonmagnetic tunnel barrier layer, a free magnetization layer, at least one capping layer, and a top electrode according to an embodiment of the present disclosure.

Referring to FIG. 6, a photoresist layer can be applied over the continuous top electrode material layer 160L, and can be lithographically patterned to form an array of discrete photoresist material portions. Each discrete photoresist material portion in the array of discrete photoresist material portions can overlie a respective one of the metallic via fill material portion 124. In one embodiment, the metallic via fill material portion 124 can be arranged as a two-dimensional periodic array having a first pitch along a first horizontal direction and a second pitch along a second horizontal direction. The discrete photoresist material portions can be arranged as a two-dimensional periodic array having the same periodicity as the two-dimensional periodic array of metallic via fill material portions 124.

An anisotropic etch process can be performed to etch unmasked regions of the continuous top electrode material layer 160L, the at least one continuous capping layer 158L, the continuous free magnetization layer 148L, the continuous nonmagnetic tunnel barrier layer 146L, the continuous SAF layer 140L, and the continuous selector material layer 130L. The chemistry of the anisotropic etch process can be selected such that patterned portions of the continuous top electrode material layer 160L, the at least one continuous capping layer 158L, the continuous free magnetization layer 148L, the continuous nonmagnetic tunnel barrier layer 146L, the continuous SAF layer 140L, and the continuous selector material layer 130L have tapered sidewalls having a taper angle in a range from 1 degree to 20 degrees, such as from 3 degrees to 10 degrees, with respective to the vertical direction. In one embodiment, the continuous nonmagnetic metallic buffer layer 128L may be used as an etch stop layer for the anisotropic etch process.

The patterned portions of the continuous top electrode material layer 160L, the at least one continuous capping layer 158L, the continuous free magnetization layer 148L, the continuous nonmagnetic tunnel barrier layer 146L, the continuous SAF layer 140L, and the continuous selector material layer 130L can constitute an array of discrete vertical stacks. Each discrete vertical stack can include, from bottom to top, a selector element 130, a synthetic antiferromagnet (SAF) structure 140, a nonmagnetic tunnel barrier layer 146, a free magnetization layer 148, at least one capping layer 158, and a top electrode 160. Each selector element 130 is a patterned portion of the continuous selector material layer 130L. Each SAF structure 140 is a patterned portion of the continuous SAF layer 140L. Each nonmagnetic tunnel barrier layer 146 is a patterned portion of the continuous nonmagnetic tunnel barrier layer 146L. Each free magnetization layer 148 is a patterned portion of the continuous free magnetization layer 148L. Each capping layer 158 is a patterned portion of the at least one continuous capping layer 158L. Each top electrode 160 is a patterned portion of the continuous top electrode material layer 160L.

The array of discrete vertical stacks (130, 140, 146, 148, 158, 160) may be formed over the substrate 9 in the memory array region 100. Each SAF structure 140 includes a layer stack of a ferromagnetic hard layer 141, an antiferromagnetic coupling layer 142, and a reference magnetization layer 143. A set of a reference magnetization layer 143, a nonmagnetic tunnel barrier layer 146, and a free magnetization layer 148 within a discrete vertical stack (130, 140, 146, 148, 158, 160) constitutes a magnetic tunnel junction (MTJ) that functions as a magnetoresistive memory element. The magnetization of the free magnetization layer 148 and the magnetization of the reference magnetization layer 143 within each discrete vertical stack (130, 140, 146, 148, 158, 160) may have two stable alignments, which include a parallel alignment and an antiparallel alignment. The bistable magnetic coupling between the ferromagnetic material of the free magnetization layer 148 and the ferromagnetic material of the reference magnetization layer 143 within each magnetic tunnel junction provides magnetoresistance, i.e., a change in the resistance between the free magnetization layer 148 and the reference magnetization layer 143 that is dependent on the alignment of the magnetization directions of the free magnetization layer 148 and the reference magnetization layer 143. Sidewalls of each element within each discrete vertical stack (130, 140, 146, 148, 158, 160) can be physically exposed after the anisotropic etch process. The photoresist layer can be subsequently removed, for example, by ashing.

While the present disclosure is described using an embodiment in which the continuous metallic barrier layer 122L, the continuous bottom electrode material layer 126L and the continuous nonmagnetic metallic buffer layer 128L are not patterned at this processing step, embodiments are expressly contemplated herein in which the continuous metallic barrier layer 122L, the continuous bottom electrode material layer 126L, and the continuous nonmagnetic metallic buffer layer 128L are patterned at this processing step.

Figure 7:
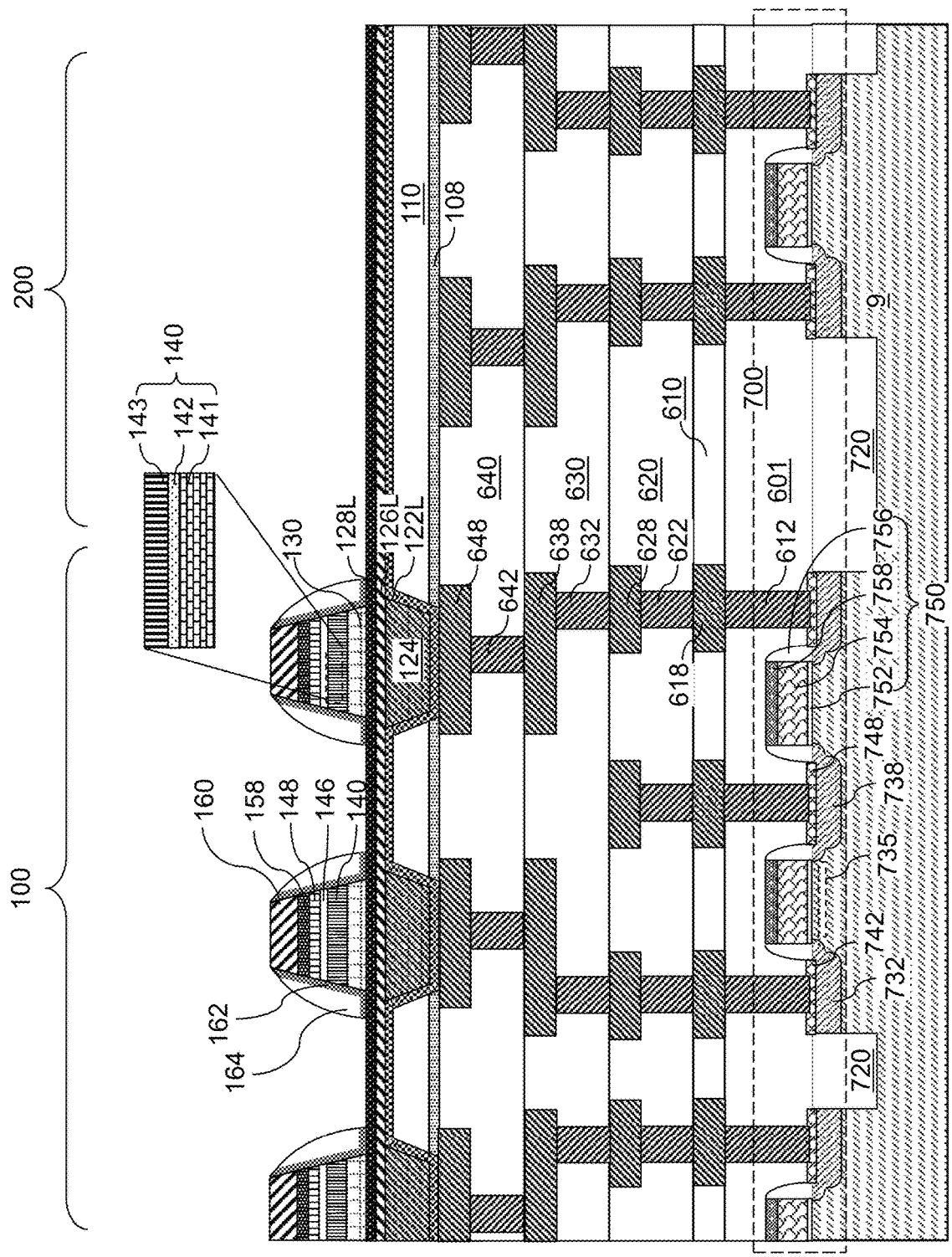
FIG. 7 is a vertical cross-sectional view of the exemplary structure after formation of an array of dielectric spacers around the according to an embodiment of the present disclosure.

Referring to FIG. 7, at least one dielectric spacer material layer can be conformally deposited over the array of discrete vertical stacks (130, 140, 146, 148, 158, 160) and on the physically exposed portions of the top surface of the continuous nonmagnetic metallic buffer layer 128L. For example, a first dielectric spacer material layer including a first dielectric spacer material and a second dielectric spacer material layer including a second dielectric spacer material can be sequentially deposited using a respective conformal deposition process (such as a chemical vapor deposition process. For example, the first dielectric spacer material can include silicon nitride or a dielectric metal oxide (such as aluminum oxide), and the second dielectric spacer material can include silicon oxide (such as TEOS oxide). The thickness of the first dielectric spacer material layer can be in a range from 3 nm to 10 nm, and the thickness of the second dielectric spacer material layer can be in a range from 30 nm to 100 nm, although lesser and greater thicknesses can be used for each of the first dielectric spacer material layer and the second dielectric spacer material layer.

An anisotropic etch process can be performed to remove horizontal portions of the at least one dielectric spacer material layer. The anisotropic etch process that etches the first dielectric spacer material and the second dielectric spacer material can be selective to the materials of the continuous nonmagnetic metallic buffer layer 128L and the top electrodes 160. Each remaining portion of the first dielectric spacer material layer constitutes a first dielectric spacer 162, and each remaining portion of the second dielectric spacer material layer constitutes a second dielectric spacer 164. Generally, an array of dielectric spacers (162, 164) can be formed around, and on, a respective discrete vertical stack (130, 140, 146, 148, 158, 160) in the array of discrete vertical stacks (130, 140, 146, 148, 158, 160). In one embodiment, each discrete vertical stack (130, 140, 146, 148, 158, 160) can be laterally surrounded by a first dielectric spacer 162 and a second dielectric spacer 164. In another embodiment, the first dielectric spacers 162 may be omitted. In such embodiments, each discrete vertical stack (130, 140, 146, 148, 158, 160) may be laterally surrounded by a single dielectric spacer, i.e., a second dielectric spacer 164.

Figure 8:
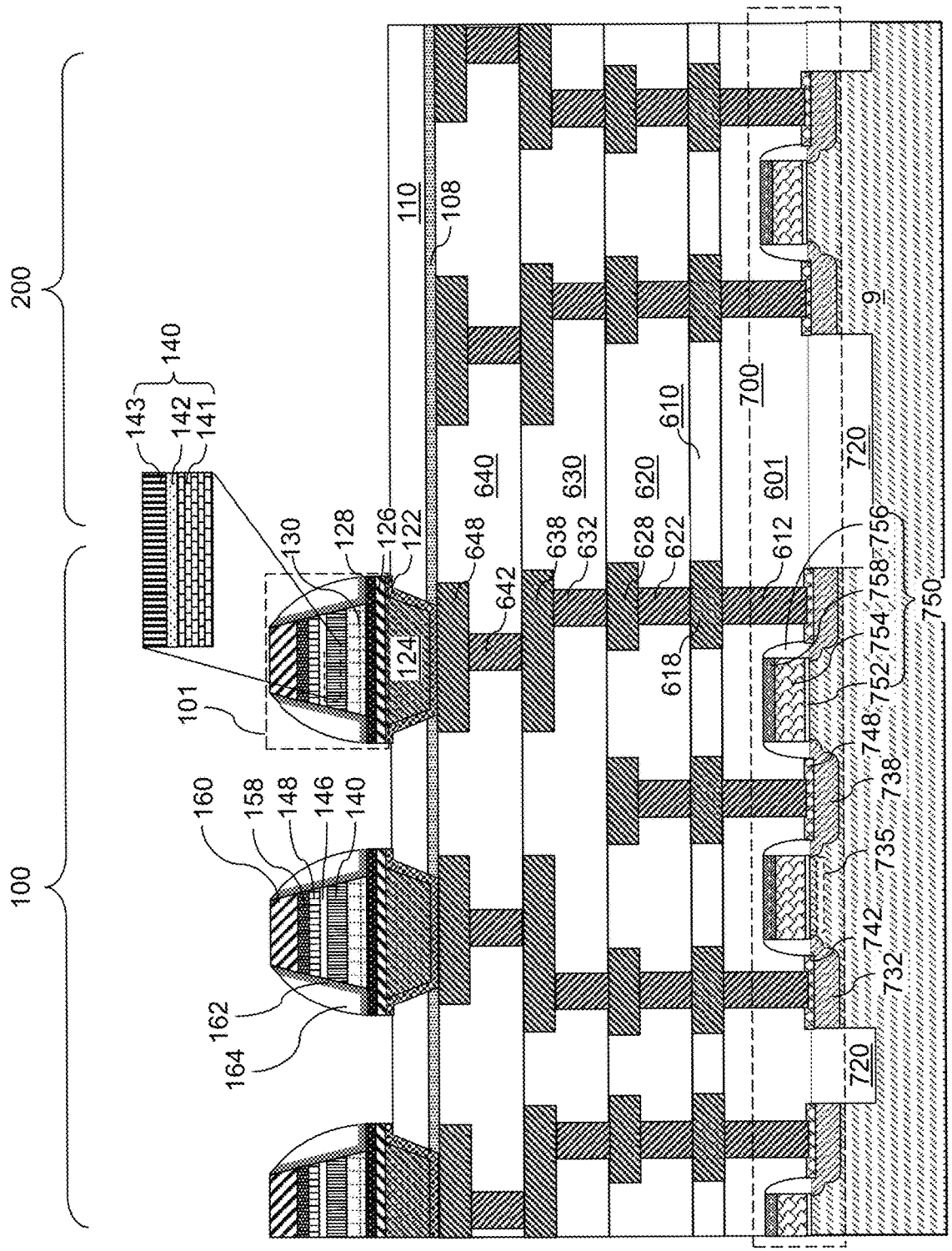
FIG. 8 is a vertical cross-sectional view of the exemplary structure after formation of nonmagnetic metallic buffer layers, bottom electrodes, and bottom electrode connection via structures according to an embodiment of the present disclosure.

Referring to FIG. 8, an etch process can be performed to pattern the continuous nonmagnetic metallic buffer layer 128L, the continuous bottom electrode material layer 126L, and the continuous metallic barrier layer 122L by performing an anisotropic etch process. In such embodiments, portions of the continuous metallic barrier layer 122L, the continuous bottom electrode material layer 126L, and the continuous nonmagnetic metallic buffer layer 128L that are not masked the array of dielectric spacers (162, 164) and the top electrodes 160 can be removed by the etch process. The etch process can be selective to material of the via-level dielectric layer 110. The etch process may include an anisotropic etch process (such as a reactive ion etch process) and/or an isotropic etch process (such as a wet etch process). If the top electrodes 160 include a different material than the materials of the continuous metallic barrier layer 122L, the continuous bottom electrode material layer 126L, and the continuous nonmagnetic metallic buffer layer 128L, the etch process may be selective to the material of the top electrodes 160 (i.e., does not etch the material of the top electrodes 160 significantly).

Each patterned portion of the continuous nonmagnetic metallic buffer layer 128L constitutes a nonmagnetic metallic buffer layer 128. Each patterned portion of the continuous bottom electrode material layer 126L constitutes a bottom electrode 126. Each patterned portion of the continuous metallic barrier layer 122L constitutes a metallic barrier layer 122. Each vertical stack of a nonmagnetic metallic buffer layer 128, a bottom electrode 126, and a metallic barrier layer 122 can have vertically coincident sidewalls that are located within a same vertical plane. Each continuous combination of a discrete vertical stack (130, 140, 146, 148, 158, 160), a nonmagnetic metallic buffer layer 128 (which is an optional component), and a bottom electrode 126 constitutes a memory cell 101, which is a magnetoresistive memory cell. Each combination of a metallic barrier layer 122 and a metallic via fill material portion 124 constitutes a bottom electrode connection via structure (122, 124) that provides electrical connection between a respective bottom electrode 126 and a respective fourth metal line structure 648.

Generally, an array of bottom electrode connection via structures (122, 124) can be formed on a respective underlying one of the metal interconnect structures. An array of memory cells 101 may be formed on the array of bottom electrode connection via structures (122, 124). The array of memory cells 101 may be formed over the substrate 9 in the memory array region 100. Each of the memory cells 101 may include a vertical stack that comprises a bottom electrode 126, a memory element (such as a magnetic tunnel junction (143, 146, 148), and a top electrode 160. Each magnetic tunnel junction (143, 146, 148) can comprise a vertical stack of a reference magnetization layer 143, a nonmagnetic tunnel barrier layer 146, and a free magnetization layer 148. In one embodiment, each of the memory cells 101 can comprise a selector element 130 disposed on a respective magnetic tunnel junction (143, 146, 148). The selector element 130 may overlie, or underlie, the respective magnetic tunnel junction (143, 146, 148).

In an alternative embodiment, the patterning of the continuous nonmagnetic metallic buffer layer 128L, the continuous bottom electrode material layer 126L, and the continuous metallic barrier layer 122L may be performed after forming the array of discrete vertical stacks (130, 140, 146, 148, 158, 160) and prior to formation of the array of dielectric spacers (162, 164). In this case, the anisotropic etch process at the processing steps of FIG. 6 can be continued until the continuous nonmagnetic metallic buffer layer 128L, the continuous bottom electrode material layer 126L, and the continuous metallic barrier layer 122L are patterned. In this case, the dielectric spacers (162, 164) can be formed on the sidewalls of the nonmagnetic metallic buffer layers 128, the bottom electrodes 126, and the metallic barrier layers 122.

Figure 9:
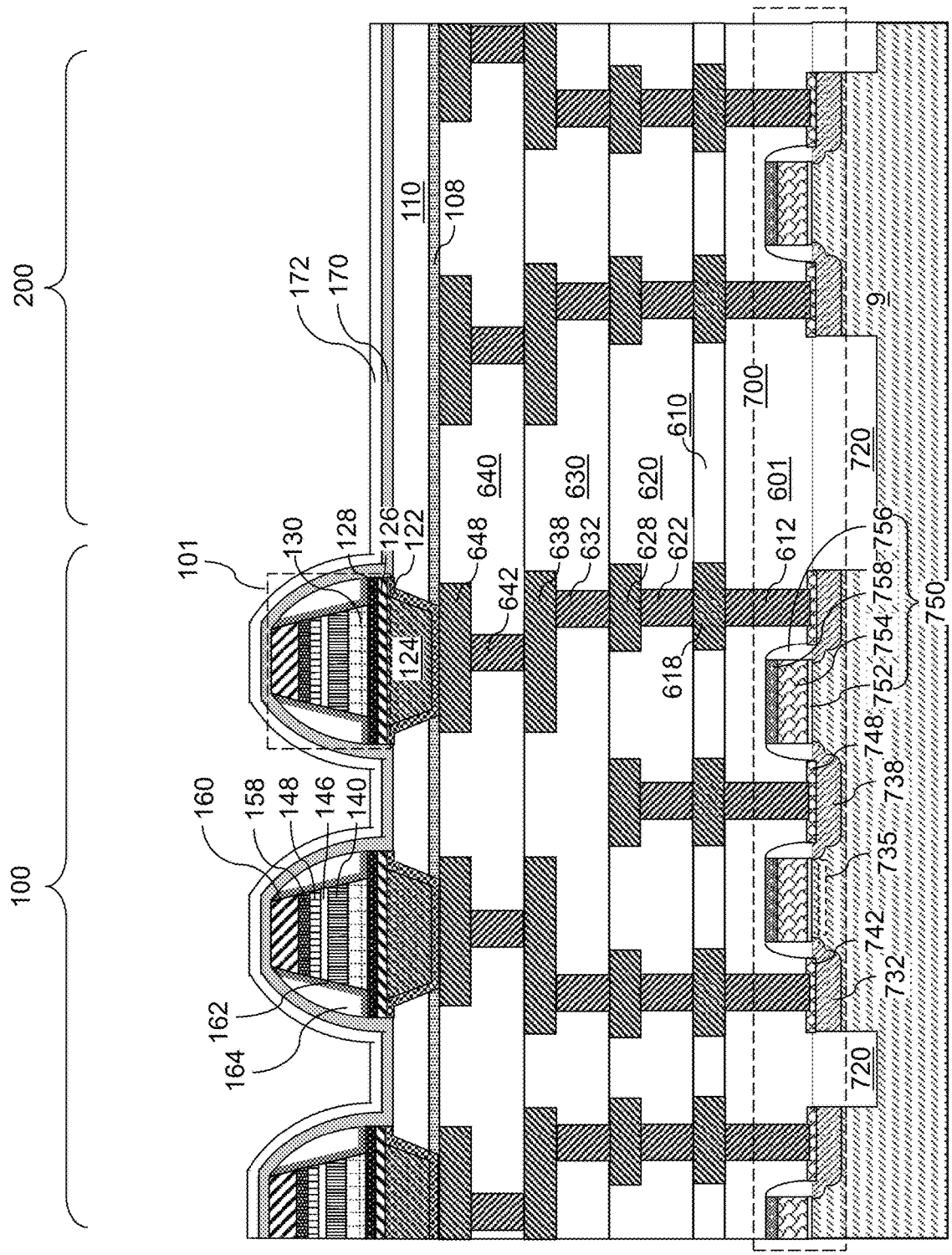
FIG. 9 is a vertical cross-sectional view of the exemplary structure after formation of an etch stop dielectric layer and a silicon oxide liner layer according to an embodiment of the present disclosure.

Referring to FIG. 9, an etch stop dielectric layer 170 and an optional silicon oxide liner layer 172 can be sequentially formed by a respective deposition process. The etch stop dielectric layer 170 includes a dielectric material that can be used as a planarization stopping material during a chemical mechanical planarization process, and can be subsequently used as an etch stop material during an anisotropic etch process. The etch stop dielectric layer 170 includes a non-reactive dielectric hard mask material. For example, the etch stop dielectric layer 170 can include, and/or can consist essentially of, silicon nitride ($Si_3N_4$), silicon oxynitride (SiON), silicon carbide (SiC), silicon carbide nitride (SiCN), silicon oxycarbide (SiOC), or a nitrogen-free antireflection layer (NFARL) including a nitrogen-free inorganic polymer material. Other suitable materials within the contemplated scope of disclosure may also be used. The etch stop dielectric layer 170 can be deposited by plasma-enhanced chemical vapor deposition (PECVD), high density plasma chemical vapor deposition (HDP-CVD) or atmospheric pressure chemical vapor deposition (APCVD). The etch stop dielectric layer 170 can be deposited conformally or non-conformally.

The etch stop dielectric layer 170 may be formed over, and on, the array of dielectric spacers (162, 164), and over the array of memory cells 101. The etch stop dielectric layer 170 comprises a horizontally-extending portion that continuously extends throughout the memory array region 100 and extends into the logic region 200, and an array of vertically-protruding portions that laterally surround each memory cell 101 in the array of memory cells 101. The thickness of a horizontally-extending portion of the etch stop dielectric layer 170 in the logic region 200 or above the top surfaces of the top electrodes 160 can be in a range from 5 nm to 50 nm, although lesser and greater thicknesses can also be used.

The optional silicon oxide liner layer 172, if present, can include a non-porous silicon oxide material such as a TEOS oxide material formed by plasma-enhanced chemical vapor deposition (PECVD). The silicon oxide liner layer 172 can include undoped silicate glass or a doped silicate glass. The silicon oxide liner layer 172 can be formed by a conformal or non-conformal deposition process. The thickness of the horizontal portions of the silicon oxide liner layer 172 located in the logic region 200 or over the top surfaces of the top electrodes 160 can be in a range from 5 nm to 50 nm, although lesser and greater thicknesses can also be used.

Figure 10:
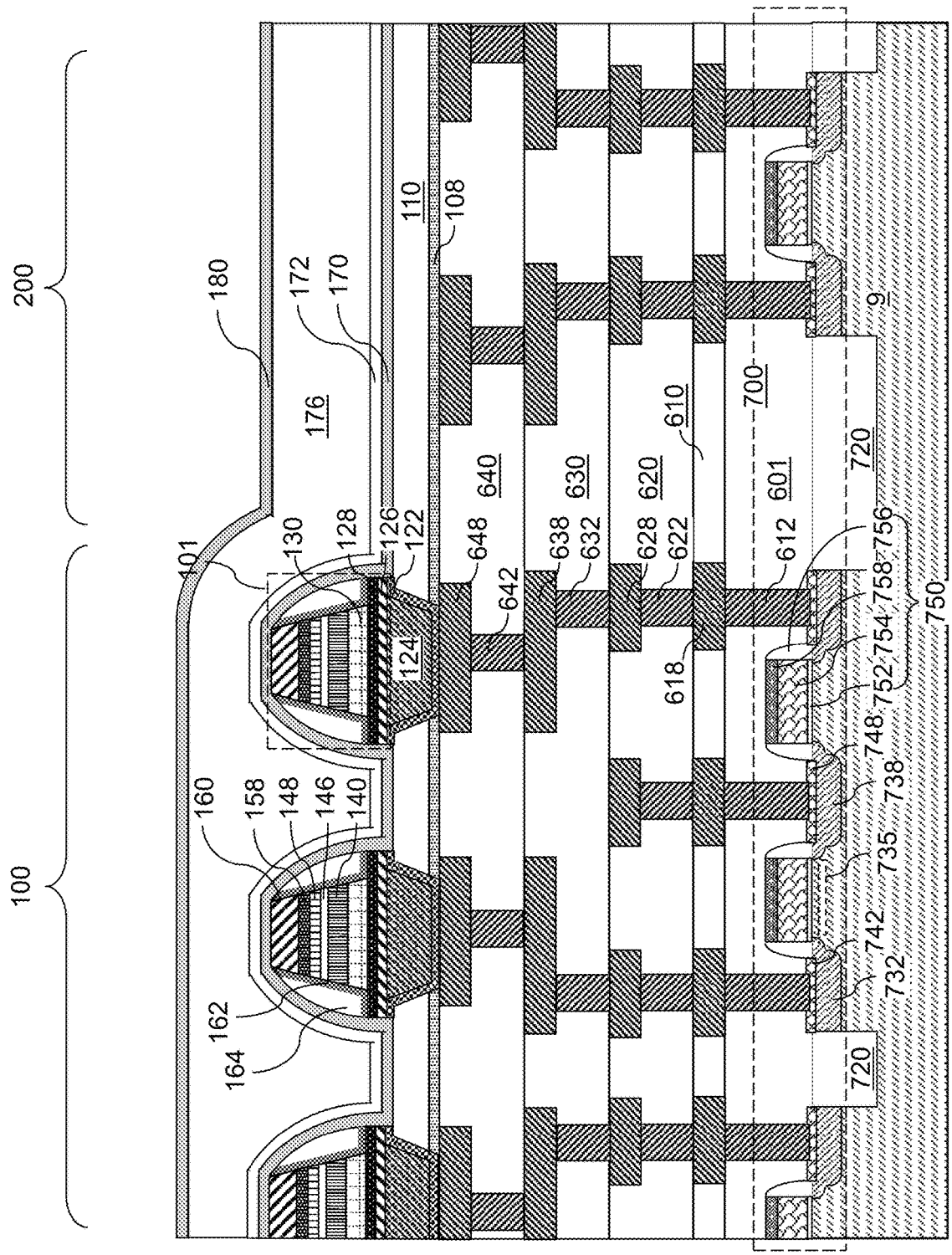
FIG. 10 is a vertical cross-sectional view of the exemplary structure after formation of a first dielectric matrix layer and a sacrificial planarization stopping material layer according to an embodiment of the present disclosure.

Referring to FIG. 10, a first dielectric matrix layer 176 can be formed over the silicon oxide liner layer 172 and the etch stop dielectric layer 170. The first dielectric matrix layer 176 can be formed by a chemical vapor deposition process. In one embodiment, the first dielectric matrix layer 176 includes a low-dielectric-constant (low-k) dielectric material having a dielectric constant less than the dielectric constant of thermal silicon oxide (i.e., 3.9). In one embodiment, the first dielectric matrix layer 176 includes an extremely-low-dielectric-constant (low-k) (ELK) dielectric material having a dielectric constant less than 2.5. In one embodiment, the first dielectric matrix layer 176 includes a porous silicon oxide-based dielectric material having a dielectric constant less than 2.5. In this case, the porous silicon oxide-based dielectric material may include a porogen-doped SiCO-based material having a porous structure. The porous structure can be formed by incorporating a pore generating material (a porogen) into a carbon-doped oxide using a chemical vapor deposition process. The chemical vapor deposition process may include a plasma-enhanced chemical vapor deposition process (PECVD) or a thermal chemical vapor deposition process. The index of refraction of the ELK dielectric material in the first dielectric matrix layer 176 may be in a range from 1.0 to 1.4 at the wavelength of 632.8 nm (which is the wavelength of commercially available HeNe laser measurement instruments).

A first portion of a top surface of the first dielectric matrix layer 176 located in the memory array region 100 may have a greater vertical separation distance from the substrate 9 than a second portion of the top surface of the first dielectric matrix layer 176 formed in the logic region 200. In other words, the top surface of the first dielectric matrix layer 176 may be higher in the memory array region 100 than in the logic region 200. The first portion of the top surface of the first dielectric matrix layer 176 can include the topmost portion of the top surface of the first dielectric matrix layer 176. The height differential between the first portion of a top surface of the first dielectric matrix layer 176 located in the memory array region 100 and the second portion of the top surface of the first dielectric matrix layer 176 formed in the logic region 200 is due to the presence of the array of memory cells 101 and the array of dielectric spacers (162, 164) in the memory array region 100.

The contour of the top surface of the first dielectric matrix layer 176 initially follows the contour of the physically exposed surfaces of the array of memory cells 101 and the array of dielectric spacers (162, 164) in the memory array region 100 during deposition of the first dielectric matrix layer 176. Upon merging of material portions of the first dielectric matrix layer 176 midway between each neighboring pair of dielectric spacers (162, 164), the contour of the top surface of the first dielectric matrix layer 176 gradually flattens, and is raised with continual accumulation of the dielectric material until termination of the deposition process for the first dielectric matrix layer 176. In one embodiment, the duration of the deposition process that deposits the first dielectric matrix layer 176 can be selected such that the top surface of the portion of the first dielectric matrix layer 176 in the logic region 200 is within the same horizontal plane as the top surfaces of the top electrodes 160. In other words, the duration of the deposition process that deposits the first dielectric matrix layer 176 can be selected such that the thickness of the first dielectric matrix layer 176 in the logic region 200 is the same as the distance obtained by adding the height of a memory cell 101 and the thickness of a metallic barrier layer 122, and then subtracting the thickness of the silicon oxide liner layer 172 in the logic region 200, and then subtracting the thickness of the etch stop dielectric layer 170 in the logic region 200.

The height differential between the first portion of a top surface of the first dielectric matrix layer 176 located in the memory array region 100 and the second portion of the top surface of the first dielectric matrix layer 176 formed in the logic region 200 can be in a range from 40% to 100%, such as from 70% to 90%, of the vertical distance between the horizontal plane including the top surface of the via-level dielectric layer 110 and the horizontal plane including the top surfaces of the top electrodes 160. In one embodiment, the first dielectric matrix layer 176 may have a vertical undulation of the height in the memory array region 100. In one embodiment, the height differential between the first portion of a top surface of the first dielectric matrix layer 176 located in the memory array region 100 and the second portion of the top surface of the first dielectric matrix layer 176 formed in the logic region 200 can be in a range from 40 nm to 400 nm, such as from 80 nm to 200 nm, although lesser and greater height differentials can also be used.

A sacrificial planarization stopping material layer 180 can be formed over the first dielectric matrix layer 176. The sacrificial planarization stopping material layer 180 includes a non-reactive dielectric hard mask material. For example, the sacrificial planarization stopping material layer 180 can include, and/or can consist essentially of, silicon nitride ($Si_3N_4$), silicon oxynitride (SiON), silicon carbide (SiC), silicon carbide nitride (SiCN), silicon oxycarbide (SiOC), or a nitrogen-free antireflection layer (NFARL) including a nitrogen-free inorganic polymer material. The sacrificial planarization stopping material layer 180 can be deposited by plasma enhanced chemical vapor deposition (PECVD), high density plasma chemical vapor deposition (HDP-CVD) or atmospheric pressure chemical vapor deposition (APCVD). The sacrificial planarization stopping material layer 180 can be deposited conformally or non-conformally. The thickness of the sacrificial planarization stopping material layer 180 in the logic region 200 can be in a range from 5 nm to 50 nm, although lesser and greater thicknesses can also be used. In one embodiment, the sacrificial planarization stopping material layer 180 can have the same material composition and the same thickness as the etch stop dielectric layer 170.

Figure 11:
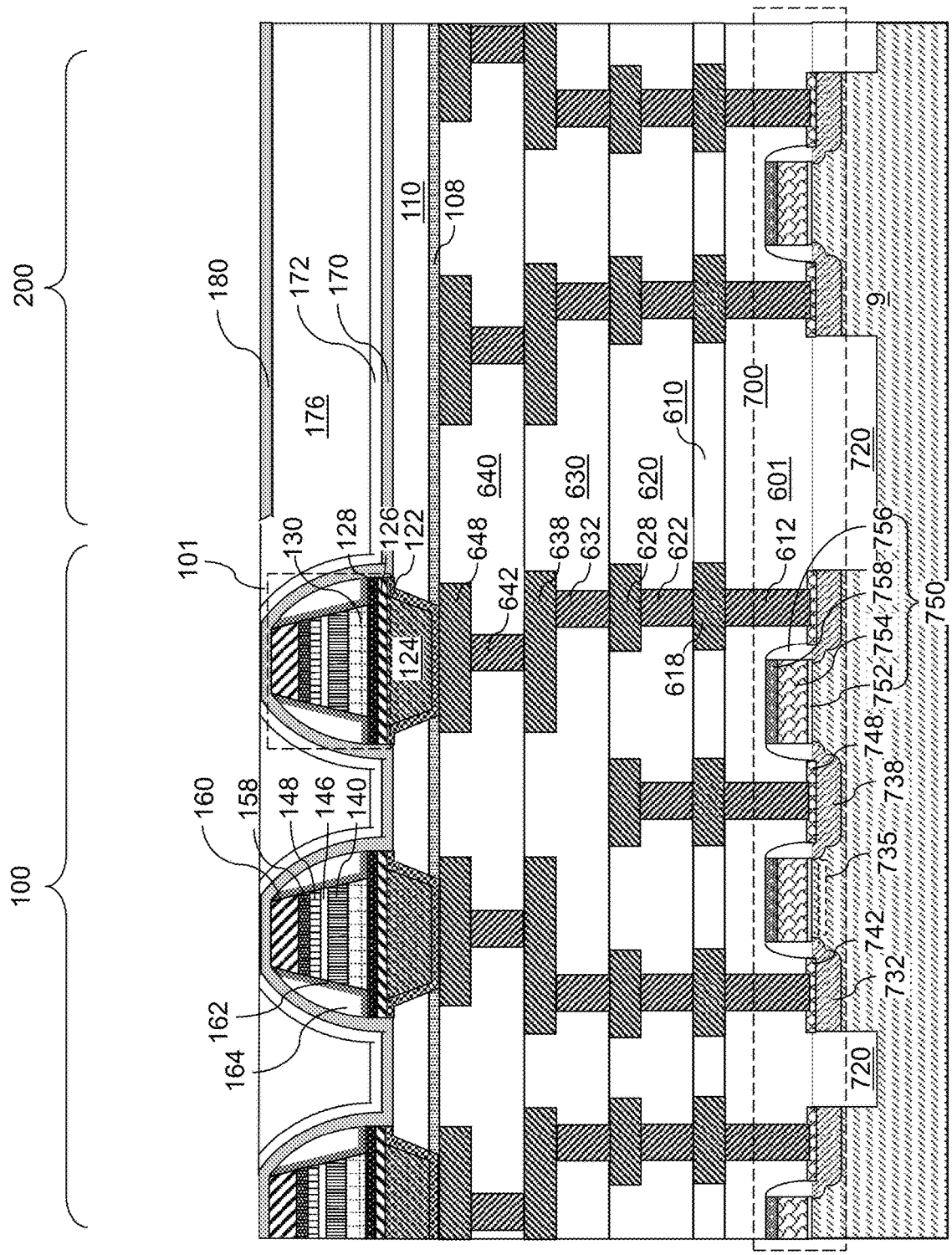
FIG. 11 is a vertical cross-sectional view of the exemplary structure after a chemical mechanical planarization process that uses portions of the etch stop dielectric layer in a memory array region and portions of the sacrificial planarization stopping material layer in a logic region as stopping structures according to an embodiment of the present disclosure.

Referring to FIG. 11, the first dielectric matrix layer 176 can be planarized by performing a chemical mechanical planarization process. Portions of the first dielectric matrix layer 176 that overlie the horizontal plane including the top surface of the sacrificial planarization stopping material layer 180 in the logic region 200 can be removed from the memory array region 100 by the chemical mechanical planarization process. The top surface of the portion of the first dielectric matrix layer 176 in the logic region 200 can be coplanar with the top surfaces of the top electrodes 160, and the thickness of the sacrificial planarization stopping material layer 180 in the logic region 200 can be the same as the thickness of the horizontal portions of the etch stop dielectric layer 170 that overlie the top electrodes 160. In such embodiments, the top surface of the sacrificial planarization stopping material layer 180 in the logic region 200 can be in the same, or approximately the same, horizontal plane as the horizontal plane including the top surfaces of the portions of the etch stop dielectric layer 170 that overlie the top electrodes 160. The sacrificial planarization stopping material layer 180 in the logic region 200 and the portions of the etch stop dielectric layer 170 that overlie the top electrodes 160 can be collectively used as planarization stopping structures during the chemical mechanical planarization process. In other words, the chemical mechanical planarization process can use top portions of the etch stop dielectric layer 170 that overlie the array of memory cells 101 as planarization stopping structures, and can use a portion of the sacrificial planarization stopping material layer 180 in the logic region 200 as an additional planarization stopping structure. Thus, the top surface of the remaining portion of the first dielectric matrix layer 176 can be within the same horizontal plane as the top surface of the sacrificial planarization stopping material layer 180 in the logic region 200 and the top surfaces of the portions of the etch stop dielectric layer 170 that overlie the top electrodes 160.

Figure 12:
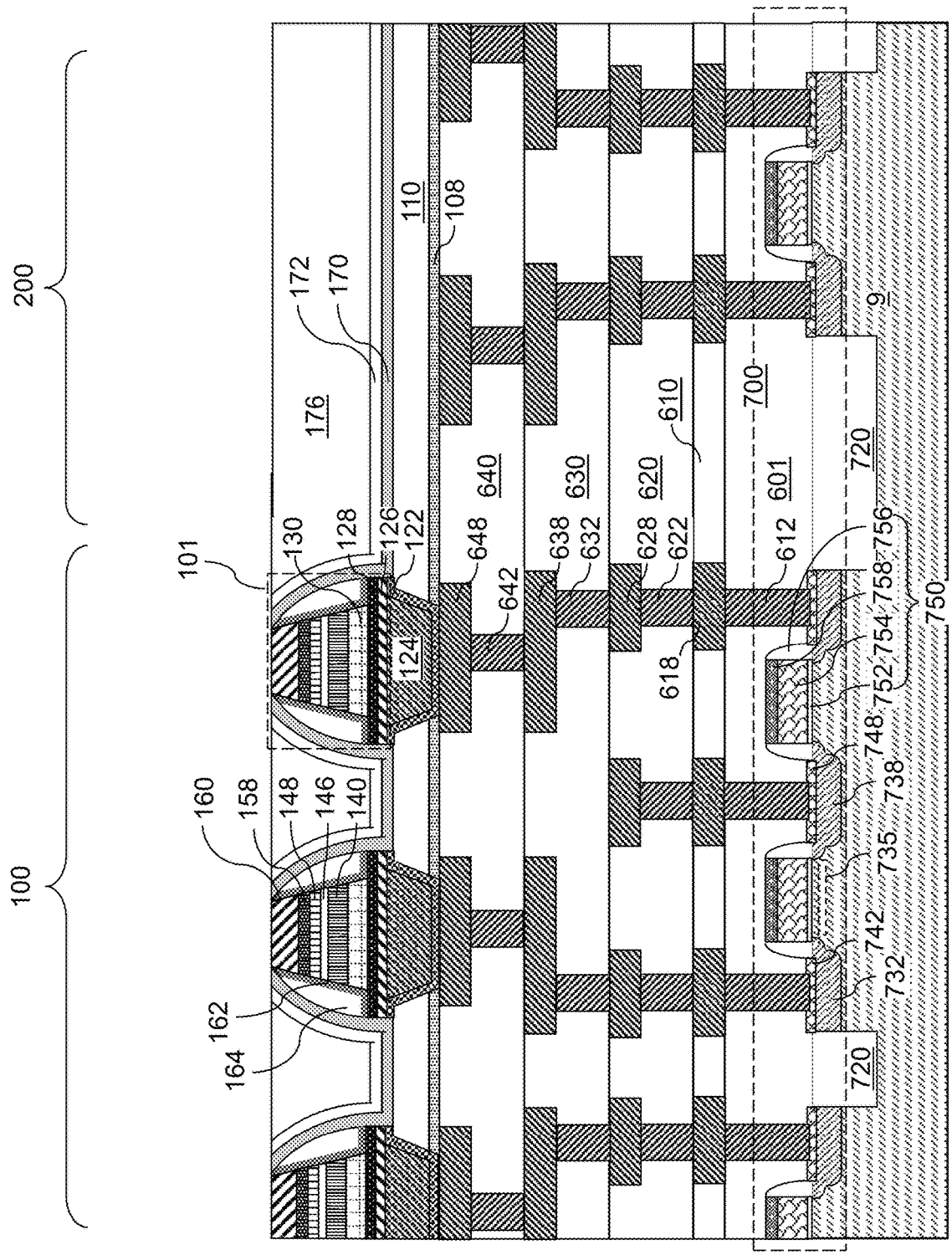
FIG. 12 is a vertical cross-sectional view of the exemplary structure after a touch-up planarization process that removes portions of the etch stop dielectric layer in the memory array region and portions of the sacrificial planarization stopping material layer in the logic region according to an embodiment of the present disclosure.

Referring to FIG. 12, a touch-up planarization process can be performed to remove portions of the etch stop dielectric layer 170 that overlie the top electrodes 160 in the memory array region 100, and to remove remaining portions of the sacrificial planarization stopping material layer 180 in the logic region 200. The touch-up planarization process may use a dry etch process, which may include an anisotropic dry etch process (such as a reactive ion etch process) or an isotropic dry etch process (such as a chemical dry etch process). In this case, the etch chemistry of the dry etch process can be selected to remove the materials of the etch stop dielectric layer 170 and the sacrificial planarization stopping material layer 180 selective to the material of first dielectric matrix layer 176, or with the same etch rate as the etch rate for the material of the first dielectric matrix layer 176. Alternatively, the touch-up planarization process may use a touch-up chemical mechanical planarization process. In this case, the chemical mechanical planarization process that removes portions of the first dielectric matrix layer 176 in the memory array region 100 may be continued until the portions of the etch stop dielectric layer 170 that overlie the top electrodes 160 in the memory array region 100 and the remaining portions of the sacrificial planarization stopping material layer 180 in the logic region 200 are removed.

Thus, portions of the etch stop dielectric layer 170 that overlie the array of memory cells 101 (each including a vertical stack of a bottom electrode 126, a memory element, and a top electrode 160) can be removed concurrently with removal of the portion of the sacrificial planarization stopping material layer 180 located in the logic region 200. Optionally, portions of the first dielectric matrix layer 176 located above the horizontal plane including the top surfaces of the top electrodes 160 can be collaterally removed during the touch-up planarization process. Generally, top surfaces of the top electrodes 160 can be physically exposed during, or after, the chemical mechanical planarization process that planarizes the first dielectric matrix layer 176.

Figure 13:
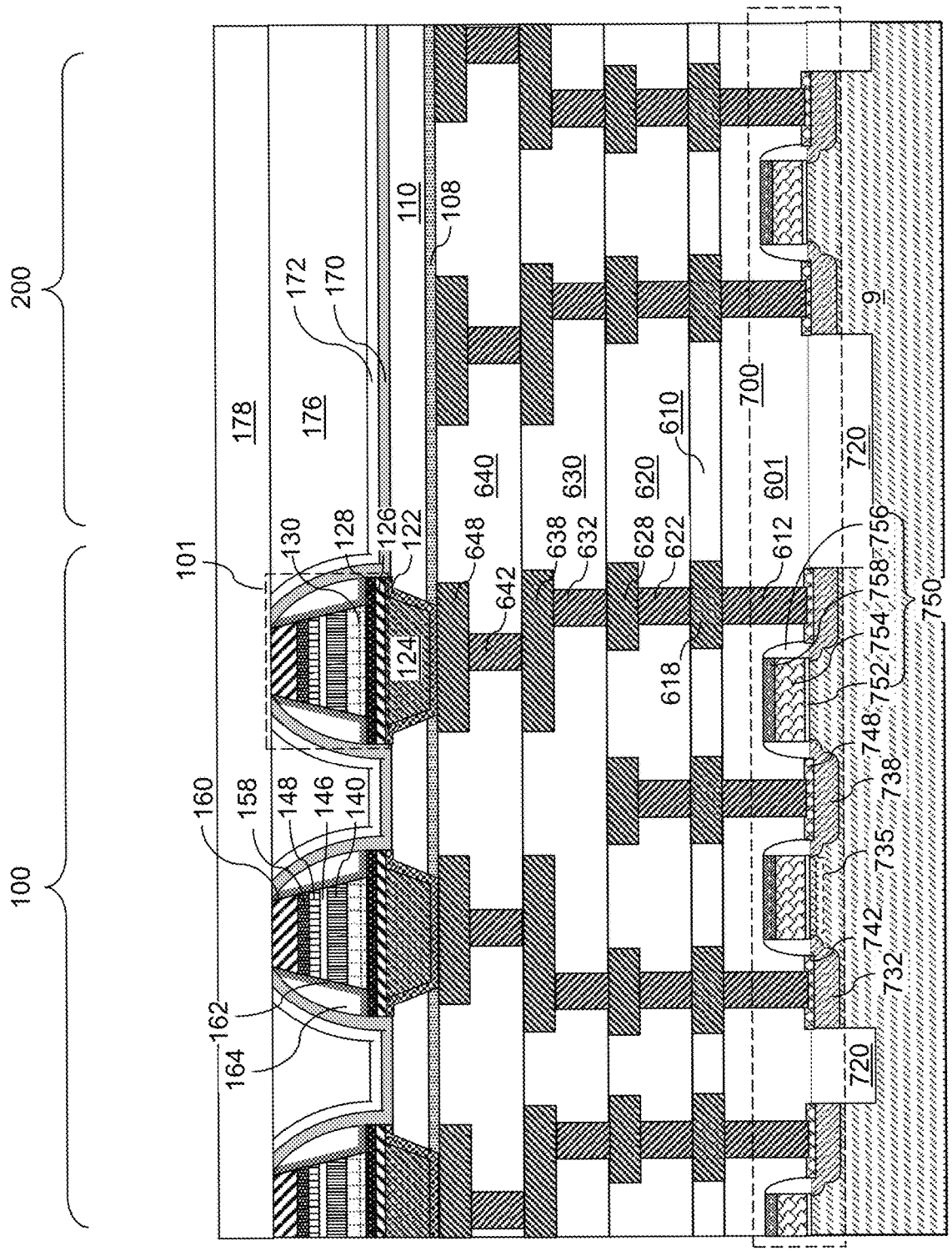
FIG. 13 is a vertical cross-sectional view of the exemplary structure after formation of a second dielectric matrix layer according to an embodiment of the present disclosure.

Referring to FIG. 13, a second dielectric matrix layer 178 can be deposited over, and directly on, the physically exposed horizontal surface of the remaining portion of the first dielectric matrix layer 176. The second dielectric matrix layer 178 may have the same material composition as, or may have a material composition that is different from, the material composition of the first dielectric matrix layer 176. In one embodiment, the second dielectric matrix layer 178 can include a low-dielectric-constant (low-k) dielectric material, such as an ELK dielectric material having a dielectric constant less than 2.5. In one embodiment, the second dielectric matrix layer 178 includes a porous silicon oxide-based dielectric material having a dielectric constant less than 2.5. The thickness of the second dielectric matrix layer 178 can be the same as the target height of metallic cell contact structures to be formed on the top surfaces of the top electrodes 160. For example, the second dielectric matrix layer 178 can have a thickness in a range from 20 nm to 160 nm, such as from 40 nm to 80 nm, although lesser and greater thicknesses can also be used. In one embodiment, the entire top surface of the second dielectric matrix layer 178 can be located within a first horizontal plane, and the entire bottom surface of the second dielectric matrix layer 178 can be located within a second horizontal plane. Thus, the entirety of the second dielectric matrix layer 178 can have a uniform thickness throughout.

Figure 14:
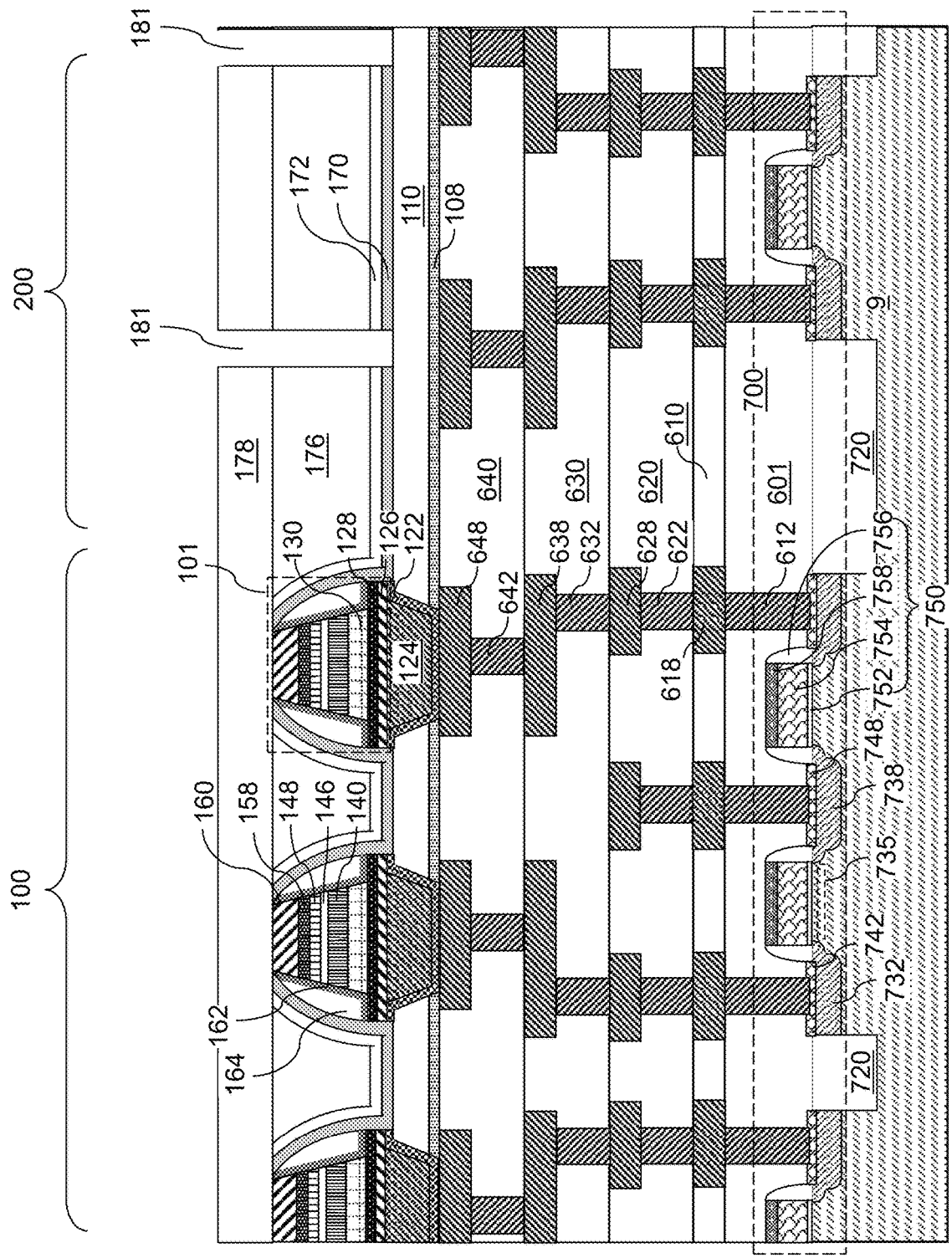
FIG. 14 is a vertical cross-sectional view of the exemplary structure after formation of via cavities in the logic region according to an embodiment of the present disclosure.

Referring to FIG. 14, a first photoresist layer (not shown) can be applied over the second dielectric matrix layer 178, and can be lithographically patterned to form an array of openings in the logic region 200. The pattern of the openings in the photoresist layer can be transferred through the second dielectric matrix layer 178, the first dielectric matrix layer 176, the silicon oxide liner layer 172, and the etch stop dielectric layer 170. In one embodiment, the etch stop dielectric layer 170 can be used as an etch stop layer for a first etch step that etches the materials of the second dielectric matrix layer 178, the first dielectric matrix layer 176, and the silicon oxide liner layer 172, and an etch chemistry that etches the material of the etch stop dielectric layer 170 may be used during a second etch step of the anisotropic etch process. Via cavities 181 are formed underneath each opening in the photoresist layer. A top surface of the via-level dielectric layer 110 can be physically exposed at the bottom of each via cavity 181. The first photoresist layer can be subsequently removed, for example, by ashing.

Figure 15:
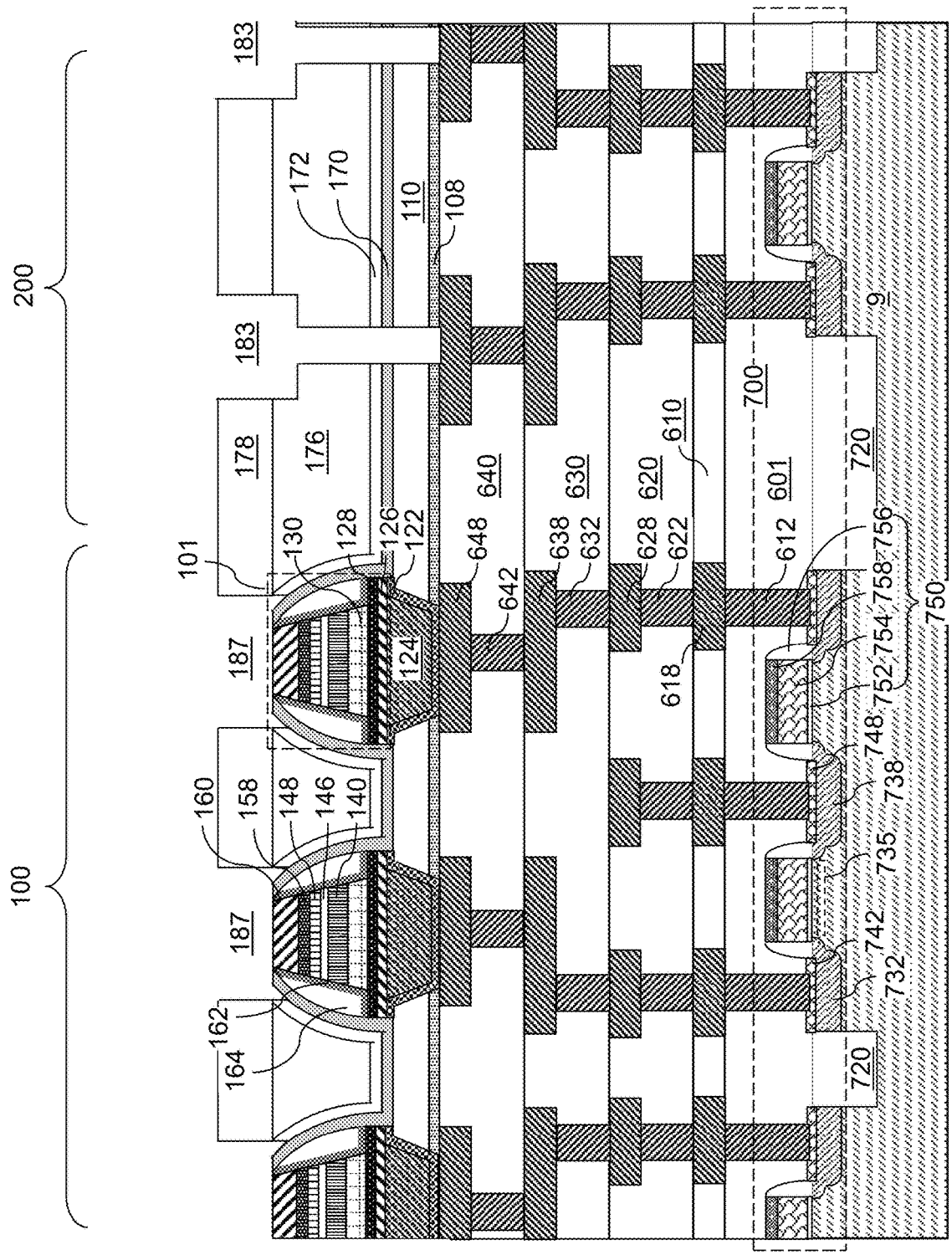
FIG. 15 is a vertical cross-sectional view of the exemplary structure after formation of integrated line and via cavities in the logic region and cell contact cavities in the memory array region according to an embodiment of the present disclosure.

Referring to FIG. 15, a second photoresist layer can be applied over the second dielectric matrix layer 178, and can be lithographically patterned to form line patterns. The areas of the line pattern in the photoresist layer can include all areas of the via cavities 181. Thus, the second photoresist layer can be removed from inside the via cavities 181 upon development of the second photoresist layer. An anisotropic etch process can be performed to transfer the line patterns in the second photoresist layer into underlying material portions. Each via cavity 181 is vertically extended through the via-level dielectric layer 110 and through the dielectric cap layer 108 so that a top surface of a respective fourth metal line structures 648 may be physically exposed underneath each via cavity 181. Further, portions of the second dielectric matrix layer 178 that are not masked by the patterned second photoresist layer may be etched through to form line cavities. Integrated line and via cavities 183 are formed in the logic region 200. Each integrated line and via cavity 183 may include a respective line cavity and at least one via cavity adjoined to a bottom surface of the respective line cavity. Cell contact cavities 187 overlying a respective one of the top electrodes 160 are formed in the memory array region 100.

According to an aspect of the present disclosure, the anisotropic etch process that forms the cell contact cavities 187 and the integrated line and via cavities 183 can be selective to the material of the etch stop dielectric layer 170. The cell contact cavities 187 may be formed through the second dielectric matrix layer 178 by performing the anisotropic etch process, which etches the material of the second dielectric matrix layer 178 selective to the material of the etch stop dielectric layer 170. In one embodiment, the lateral extent of a cell contact cavity 187 (which is herein referred to as a first cell contact cavity) selected from the array of cell contact cavities 187 can be greater than the lateral extent of a respective underlying top electrode 160, i.e., greater than the lateral extent of the top electrode that underlies the first cell contact cavity. In one embodiment a plurality of cell contact cavities 187 can have a respective lateral extent that is greater than the lateral extent of a respective underlying top electrode 160. In one embodiment, each of the cell contact cavities 187 can have a respective lateral extent that is greater than the lateral extent of a respective underlying top electrode 160. In this case, each cell contact cavity 187 (such as the first cell contact cavity) having a greater lateral extent than the lateral extent of a respective underlying top electrode 160, can extend into an upper portion of the first dielectric matrix layer 176, and thus, can include a downward-protruding portion that extends below the horizontal plane including the top surfaces of the top electrodes 160 and overlying a tapered portion of the etch stop dielectric layer 170.

In one embodiment, the bottom surfaces of the line trenches within the integrated line and via cavities 183 can be formed below the horizontal interface between the first dielectric matrix layer 176 and the second dielectric matrix layer 178. Vertically-protruding portions of the etch stop dielectric layer 170 that laterally surround the memory cells 101 function as etch stop material portions while the bottom surfaces of the line trenches are vertically recessed below the horizontal interface between the first dielectric matrix layer 176 and the second dielectric matrix layer 178. Thus, the cell contact cavities 187 do not extend through the etch stop dielectric layer 170, and do not contact any of the underlying dielectric spacers (162, 164). Accordingly, sidewalls of the various layers within each memory cell 101 remain covered with a respective one of the dielectric spacers (162, 164).

Figure 16:
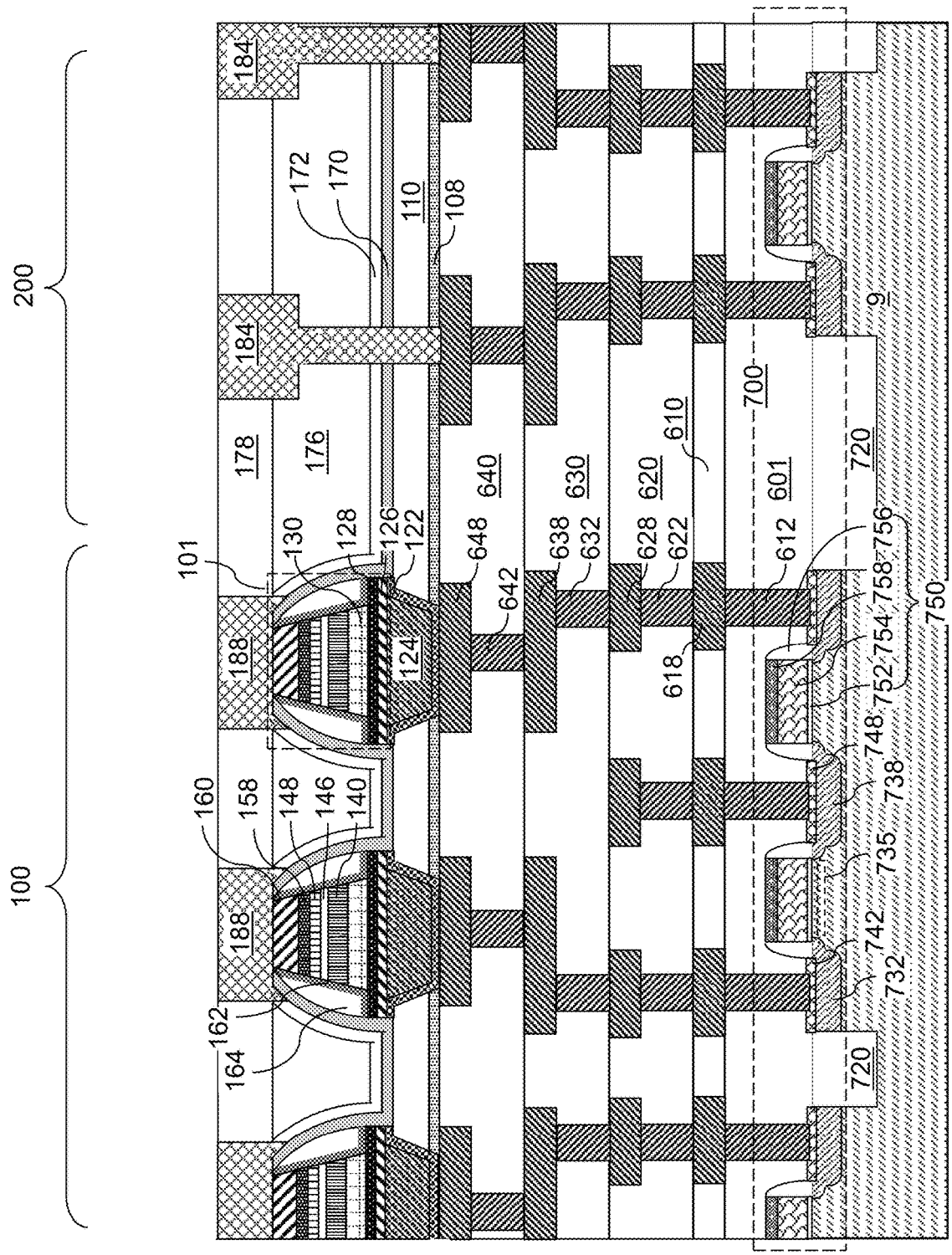
FIG. 16 is a vertical cross-sectional view of the exemplary structure after formation of integrated line and via structures in the logic region and metallic cell contact structures in the memory array region according to an embodiment of the present disclosure.

Referring to FIG. 16, at least one conductive material can be deposited in the line and via cavities 183 and in the cell contact cavities 187. The at least one conductive material can include, for example, a metallic liner material such as TiN, TaN, or WN, and a metallic fill material such as W, Cu, Co, Ru, Mo, Al, alloys thereof, and/or a layer stack thereof. Other suitable materials within the contemplated scope of disclosure may also be used. Excess portions of the at least one conductive material overlying the horizontal plane including the top surface of the second dielectric matrix layer 178 can be removed by a planarization process such as a chemical mechanical polish process. Each remaining portion of the at least one conductive material that fills an integrated line and via cavity 183 constitutes an integrated line and via structure 184. Each remaining portion of the at least one conductive material that fills a cell contact cavity 187 constitutes metallic cell contact structure 188. The integrated line and via structure 184, the metallic cell contact structure 188, and the bottom electrode connection via structure (122, 124) collectively constitute memory-cell-level metal interconnect structures (122, 124, 184, 188), i.e., metal interconnect structures that are located in the memory cell level that occupies the volume between the horizontal plane including the top surfaces of the fourth metal line structures 648 and the horizontal plane including the top surfaces of the integrated line and via structure 184 and the metallic cell contact structure 188.

Figure 17:
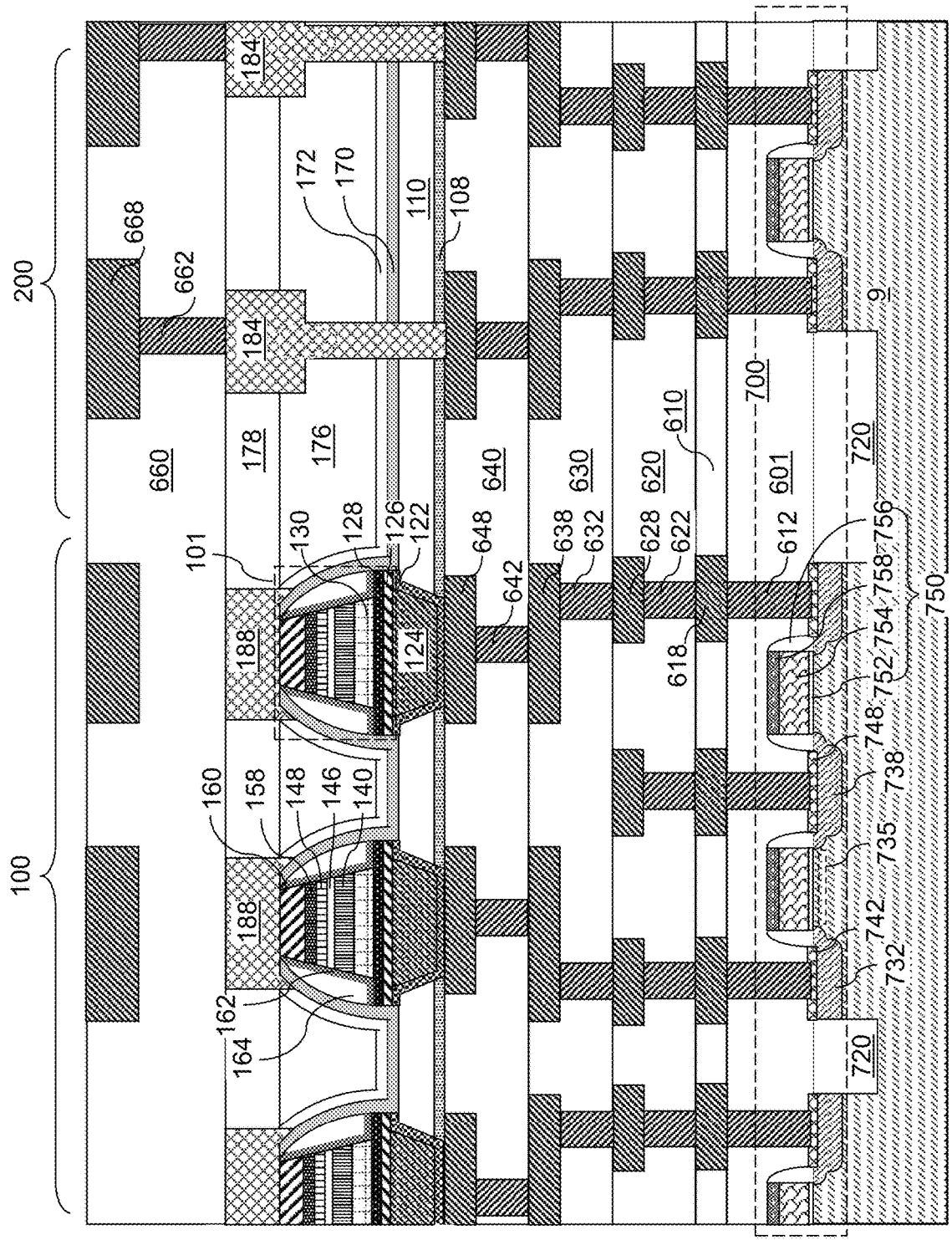
FIG. 17 is a vertical cross-sectional view of the exemplary structure after formation of additional metal interconnect structures formed in additional dielectric material layers according to an embodiment of the present disclosure.

Referring to FIG. 17, additional dielectric material layers and additional metal interconnect structures can be subsequently formed as needed. The combination of the dielectric cap layer 108, the via-level dielectric layer 110, the etch stop dielectric layer 170, the silicon oxide liner layer 172, the first dielectric matrix layer 176, and the second dielectric matrix layer 178 collectively function as a fifth line-and-via-level dielectric material layer. A sixth line-and-via-level dielectric material layer 660 can be formed over the second dielectric matrix layer 178. Fifth metal via structures 662 can be formed in a lower portion of the sixth line-and-via-level dielectric material layer 660, and sixth metal line structures 668 formed in an upper portion of the sixth line-and-via-level dielectric material layer 640. Bonding pads (not shown) can be formed over the additional metal interconnect structures.

Figure 18:
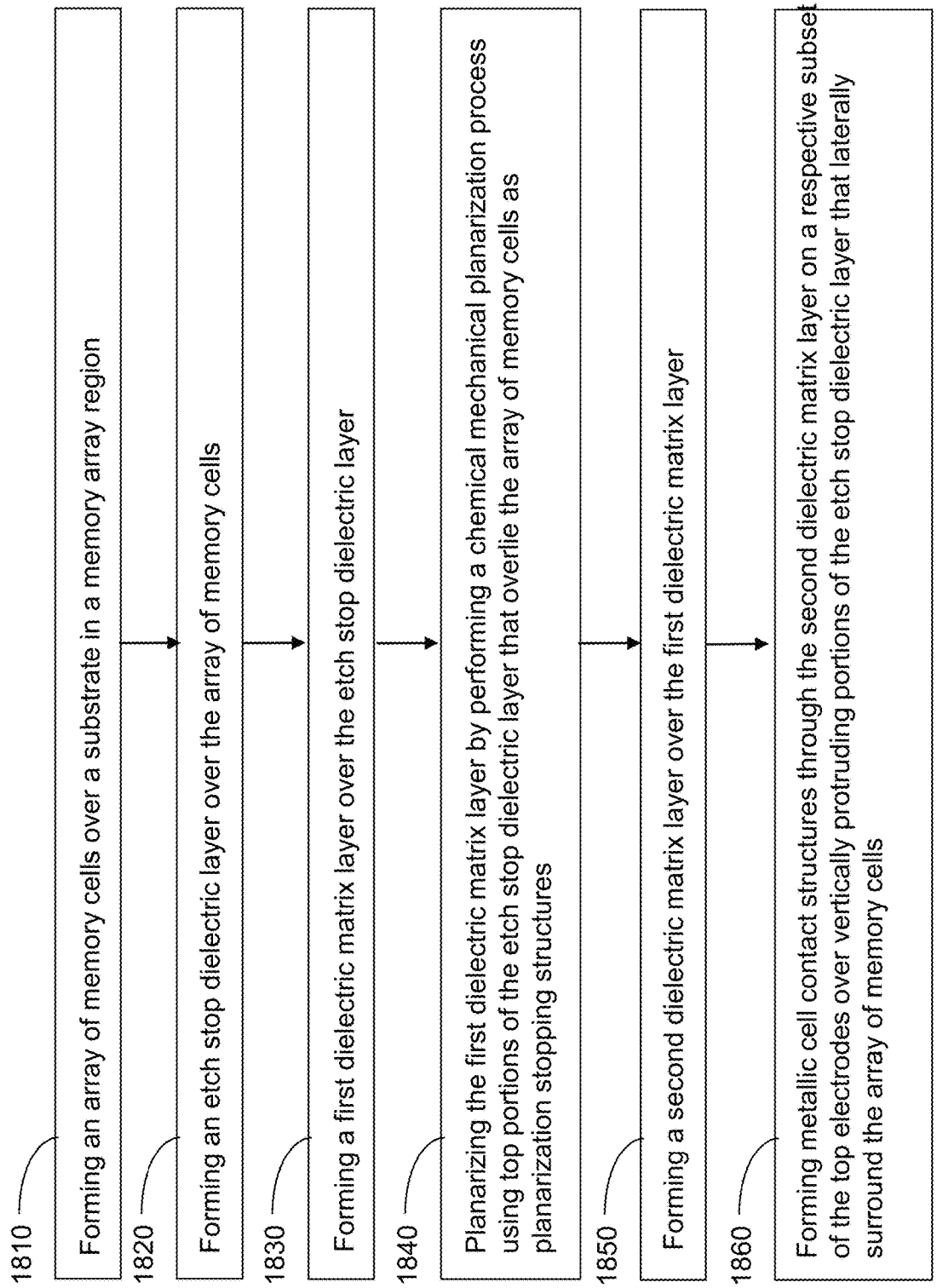
FIG. 18 is a flowchart that illustrates the general processing steps of the methods of the present disclosure.

Referring to FIG. 18, a general method of forming a memory device is provided according to an embodiment of the present disclosure. Referring to step 1810, an array of memory cells 101 can be formed over a substrate 9 in a memory array region 100.

Each of the memory cells 101 includes a vertical stack that comprises a bottom electrode 126, a memory element (such as a magnetic tunnel junction (143, 146, 148)), and a top electrode 160. Referring to step 1820, an etch stop dielectric layer 170 can be formed over the array of memory cells 101. The etch stop dielectric layer 170 includes a horizontally-extending portion that continuously extends throughout the memory array region 100 and extends into a logic region 200. Referring to step 1830, a first dielectric matrix layer 176 can be formed over the etch stop dielectric layer 170. A first portion of a top surface of the first dielectric matrix layer 176 in the memory array region 100 has a greater vertical separation distance from the substrate 9 than a second portion of the top surface of the first dielectric matrix layer 176 formed in the logic region 200. Referring to step 1840, the first dielectric matrix layer 176 can be planarized by performing a chemical mechanical planarization process using top portions of the etch stop dielectric layer 170 that overlie the array of memory cells 101 as planarization stopping structures. Referring to step 1850, a second dielectric matrix layer 178 can be formed over the first dielectric matrix layer 176. Referring to step 1860, metallic cell contact structures 188 can be formed through the second dielectric matrix layer 178 on a respective subset of the top electrodes 160 over vertically protruding portions of the etch stop dielectric layer 170 that laterally surround the array of memory cells 101.

Referring to all drawings and according to various embodiments of the present disclosure, a memory device using an etch stop dielectric layer 170 is provided. The etch stop dielectric layer 170 includes a horizontally-extending portion that continuously extends throughout the memory array region 100 and the logic region 200, and further includes an array of vertically-protruding portions that laterally surround each memory cell 101 in the array of memory cells 101. Each of the vertically-protruding portions includes a respective opening at a topmost region and a respective annular topmost surface that is located within a horizontal plane including top surfaces of the top electrodes 160.

The first dielectric matrix layer 176 overlies the horizontally-extending portion of the etch stop dielectric layer 170, and laterally surrounds the array of vertically-protruding portions of the etch stop dielectric layer 170. The second dielectric matrix layer 178 overlies the first dielectric matrix layer 176. The second dielectric matrix layer 178 can have a bottom surface located within the horizontal plane including the top surfaces of the top electrodes 160. Further, the second dielectric matrix layer 178 can have a top surface located within a horizontal plane including top surfaces of the metallic cell contact structures 188.

In one embodiment, each annular topmost surface of the vertically-protruding portions of the etch stop dielectric layer 170 may include an inner periphery that coincides with a periphery of one of the top surfaces of the top electrodes 160. In one embodiment, an outer periphery of each annular topmost surface of the vertically-protruding portions of the etch stop dielectric layer 170 can be laterally offset outward from the inner periphery by a uniform lateral offset distance. The uniform lateral offset distance may be greater than the thickness of the vertically-protruding portions of the etch stop dielectric layer 170 due to the taper of the vertically-protruding portions of the etch stop dielectric layer 170 over the dielectric spacers (162, 164). In one embodiment, the outer peripheries and the inner peripheries of the annular topmost surfaces of the vertically-protruding portions of the etch stop dielectric layer 170 can be located within the horizontal plane including the top surfaces of the top electrodes 160.

The metallic cell contact structures 188 extend through the second dielectric matrix layer 178, and are formed on a respective subset of the top electrodes 160. In one embodiment, each of the metallic cell contact structures 188 can contact a row of top electrodes 160 or a column of top electrodes 160 within a two-dimensional array of memory cells 101. Alternatively, each of the metallic cell contact structures 188 can contact a respective single top electrode 160 within a two-dimensional array of memory cells 101. In this case, metal interconnect structures that are subsequently formed over the metallic cell contact structures 188 may be used to electrically connect a row of metallic cell contact structures 188 or a column of metallic cell contact structures 188.

The metallic cell contact structures 188 are formed over the vertically protruding portions of the etch stop dielectric layer 170 that laterally surround the array of memory cells 101. The metallic cell contact structures 188 can contact a respective subset of the vertically-protruding portions of the etch stop dielectric layer 170. At least one metallic cell contact structure 188 (such as a first metallic cell contact structure that is formed in the first cell contact cavity) can comprise a downward-protruding portion contacting a tapered portion of the etch stop dielectric layer 170, i.e., contacting a tapered convex segment of an outer sidewall of a laterally protruding portion of the etch stop dielectric layer 170.

In one embodiment, at least one of the metallic cell contact structures 188 can include a planar bottom surface that contacts a planar top surface of a respective one of the top electrodes 160, and a tapered downward-protruding portion that extends downward below the horizontal plane including the top surfaces of the top electrodes 160 and contacting a tapered outer sidewall of a respective one of the vertically-protruding portions of the etch stop dielectric layer 170.

Each integrated line and via structure 188 can include a line portion and at least one via portion. Each line portion can have a planar top surface that is located within a horizontal plane including top surfaces of the metallic cell contact structures 188 and a planar bottom surface that is located below a horizontal plane including top surfaces of the top electrodes 160. Each via portion can extends through the horizontally-extending portion of the etch stop dielectric layer 170, and contact a top surface of a respective one of the fourth metal line structures 648.

In one embodiment, metal interconnect structures (612, 618, 622, 628, 632, 638, 642, 648) formed in dielectric material layers (601, 610, 620, 630, 640) can be located between the etch stop dielectric layer 170 and the substrate 9. In one embodiment, memory-cell-level metal interconnect structures (such as the integrated line and via structures 188) can be located in the logic region 200. Such memory-cell-level metal interconnect structures can extend through the horizontally-extending portion of the etch stop dielectric layer 170, and can have top surfaces within a horizontal plane including top surfaces of the metallic cell contact structures 184. In one embodiment, at least one of the memory-cell-level metal interconnect structures can comprise an integrated line and via structure 184 that includes a line portion having a planar bottom surface that is located below the horizontal plane including the top surfaces of the top electrodes 160, and includes a via portion that extends through the horizontally-extending portion of the etch stop dielectric layer 170.

In one embodiment, an array of bottom electrode connection via structures (122, 124) can be provided, which can contact a respective one of the bottom electrodes 126 of the array of memory cells 101, and can contact a respective one of the metal interconnect structures (such as a fourth metal line structures 648) formed in the dielectric material layers.

In one embodiment, each of the bottom electrodes 126 can include a respective sidewall that contacts the etch stop dielectric layer 170, and an array of dielectric spacers (162, 164) can laterally surround, and can contact, a respective memory cell 101 in the array of memory cells 101. Each dielectric spacer (162, 164) in the array of dielectric spacers (162, 164) can be laterally surrounded by, and can be contacted by, a respective sidewall of the etch stop dielectric layer 170.

In one embodiment, each memory cell 101 can include a vertical stack containing a bottom electrode 126, a memory element (such as a magnetic tunnel junction (143, 146, 148), and a top electrode 160. In one embodiment, each of the magnetic tunnel junctions comprises a vertical stack of a reference magnetization layer 143, a nonmagnetic tunnel barrier layer 146, and a free magnetization layer 148. In one embodiment, each of the memory cells 101 can comprise a selector element disposed on a respective magnetic tunnel junction (143, 146, 148).

By providing an etch stop etch stop dielectric layer 170, the thickness of a first dielectric matrix layer 176 after a chemical mechanical planarization process may be more accurately controlled. Subsequent deposition of a second dielectric matrix layer 178 that overlies the first dielectric matrix layer 176 can then form a more uniform layer having a target thickness. Thus, the dielectric matrix layer thickness range is improved. By insuring that the chemical mechanical planarization process removes an accurate amount of the first dielectric matrix layer 176, subsequent etch processes may avoid overetch or underetch errors. Thus, unwanted electrical short and open issues may be avoided. Consequently, devices that are formed using the various embodiment methods may reduce the electrical open and short failure rate afflicting devices using conventional processes. In addition, the metal trench landing window may be enlarged.

According to an aspect of the present disclosure, horizontal portions of the etch stop dielectric layer 170 overlying the memory cells 101 augment the sacrificial planarization stopping material layer 180 as planarization stopping structures in the memory array region 100 during planarization of the first dielectric matrix layer 176. Thus, both the memory array region 100 and the logic region 200 includes planarization stopping structures with sufficiently high areal coverage, and dishing of the first dielectric matrix layer 176 in the memory array region 100 can be avoided. Thus, erosion of the top electrodes 160 can be avoided or minimized through use of the etch stop dielectric layer 170. Removal of the horizontal portions of the etch stop dielectric layer 170 can be performed with a controlled removal process selective to the top electrodes 160, allowing physical exposure of the top surfaces of the top electrodes 160 and deposition of the second dielectric matrix layer 178 directly on the top surfaces of the top electrodes 160.

Further, the remaining portions of the etch stop dielectric layer 170 can include annular horizontal surfaces having inner peripheries that coincide with peripheries of the top electrodes 160. Thus, the underlying dielectric spacers (162, 164) can be covered by the etch stop dielectric layer 170 after the top surfaces of the top electrodes 160 are physically exposed after the touch-up planarization process without any gap between the top electrodes 160 and the remaining portions of the etch stop dielectric layer 170. The etch stop dielectric layer 170 can be subsequently used as an etch stop structure during formation of the cell contact cavities. Thus, the cell contact cavities 187 and the metallic cell contact structures 188 do not extend through the dielectric spacers (162, 164), and thus, do not contact sidewalls of the memory cells 101. In other words, the etch stop dielectric layer 170 ensures that the metallic cell contact structures 188 contact only top surfaces of the top electrodes 160 of all structural components of the memory cells 101.

Therefore, the etch stop dielectric layer 170 provides the dual function as a planarization stopping structure during a chemical mechanical planarization structure and as an etch stop structure during a subsequent anisotropic etch process that forms the cell contact cavities 187. The etch stop dielectric layer 170 provides the benefit of a self-aligned contact configuration between each vertically neighboring pair of a top electrode 160 and a metallic cell contact structure 188. The contact area between each underlying top electrode 160 and an overlying metallic cell contact structure 188 can be the same as the surface area of the top surface of the underlying top electrode 160 for each memory cell 101. Further, the etch stop dielectric layer 170 ensures that any downward protruding portion of the metallic cell contact structures 188 does not extend into dielectric spacers (162, 164) and does not contact any sidewall of vertical layer stack including the magnetic tunnel junction (140, 146, 148). The self-aligned contact configuration between the top electrodes 160 and the metallic cell contact structures 188 enable scaling of lateral dimensions of the top electrodes 160 below a critical dimension, i.e., a minimum dimension that can be printed using a single lithographic exposure and development process.

The etch stop dielectric layer 170 can increase the process window for the chemical mechanical planarization process that planarizes the first dielectric matrix layer 176, thereby enhancing the thickness uniformity of the first dielectric matrix layer 176. In other words, the thickness range of the combination of the etch stop dielectric layer 170, the silicon oxide liner layer 172, the first dielectric matrix layer 176, and the second dielectric matrix layer 178 has lesser thickness variations than would be otherwise possible without use of the etch stop dielectric layer 170. In a non-limiting illustrative example, the height variation of the top surface of the second dielectric matrix layer 178 in the memory array region 100 can be less than 10 nm.

Further, the etch stop dielectric layer 170 can increase the process window for forming the cell contact cavities 187, thereby reducing electrical shorts between the metallic cell contact structures 188 and components of the memory cell 101 that underlie the top electrode 160 (such as the magnetic tunnel junction (143, 146, 148) and the bottom electrode 126), and also reducing electrical opens between the metallic cell contact structures 188 and the top electrodes 160. The enhancement of the process window is partly due to the enhancement in the thickness uniformity of the combination of the first dielectric matrix layer 176 and the second dielectric matrix layer 178, and partly due to the presence of the etch stop dielectric layer 170 as an etch stop structure during formation of the cell contact via cavities 187.

Portions of the first dielectric matrix layer 176 that overlie the top surfaces of the top electrodes 160 are completely removed from the memory array region 100, and the height of the metallic cell contact structures 188 is decided by the thickness of the second dielectric matrix layer 178.

According to an aspect of the present disclosure, a memory device is provided, which includes: an array of memory cells 101 overlying a substrate 9 and located in a memory array region 100. Each of the memory cells 101 can include a vertical stack containing a bottom electrode 126, a memory element (such as, but not limited to, a magnetic tunnel junction (143, 146, 148), and a top electrode 160. A logic region 200 can be located outside the memory array region 100. The logic region 200 can be free of memory cells 101, i.e., does not contain any memory cell 101. An etch stop dielectric layer 170 can include a horizontally-extending portion that continuously extends throughout the memory array region 100 and the logic region 200, and can include an array of vertically-protruding portions that laterally surround each memory cell 101 in the array of memory cells 101. Each of the vertically-protruding portions of the etch stop dielectric layer 170 includes a respective opening at a topmost region. Further, each of the vertically-protruding portions of the etch stop dielectric layer 170 includes a respective annular topmost surface that is located within a horizontal plane including top surfaces of the top electrodes 160. Metallic cell contact structures 188 can contact a respective subset of the top electrodes 160 and a respective subset of the vertically-protruding portions of the etch stop dielectric layer 170.

According to another aspect of the present disclosure, a magnetic tunnel junction (MTJ) memory device is provided, which includes an array of memory cells 101 overlying a substrate 9 and located in a memory array region 100. Each of the memory cells 101 includes a vertical stack containing a bottom electrode 126, a memory element containing a magnetic tunnel junction (143, 146, 148), and a top electrode 160. A logic region 200 that is free of memory cells 101 can be located outside the memory array region 100. An etch stop dielectric layer 170 can laterally surround each memory cell 101 in the array of memory cells, and can extend into the logic region 200. Vertically-protruding portions of the etch stop dielectric layer 170 includes a respective annular topmost surface having an inner periphery and an outer periphery that are located within a horizontal plane including top surfaces of the top electrodes 160. Metallic cell contact structures 188 contact a respective subset of the top electrodes 160 and a respective subset of the vertically-protruding portions of the etch stop dielectric layer 170.

According to yet another aspect of the present disclosure, a method of forming a memory device is provided. An array of memory cells 101 can be formed over a substrate 9 in a memory array region 100. Each of the memory cells 101 includes a vertical stack that comprises a bottom electrode 126, a memory element (such as a magnetic tunnel junction (143, 146, 148)), and a top electrode 160. An etch stop dielectric layer 170 can be formed over the array of memory cells 101. The etch stop dielectric layer 170 includes a horizontally-extending portion that continuously extends throughout the memory array region 100 and extends into a logic region 200. A first dielectric matrix layer 176 can be formed over the etch stop dielectric layer 170. A first portion of a top surface of the first dielectric matrix layer 176 in the memory array region 100 has a greater vertical separation distance from the substrate 9 than a second portion of the top surface of the first dielectric matrix layer 176 formed in the logic region 200. The first dielectric matrix layer 176 can be planarized by performing a chemical mechanical planarization process using top portions of the etch stop dielectric layer 170 that overlie the array of memory cells 101 as planarization stopping structures. A second dielectric matrix layer 178 can be formed over the first dielectric matrix layer 176. Metallic cell contact structures 188 can be formed through the second dielectric matrix layer 178 on a respective subset of the top electrodes 160 over vertically protruding portions of the etch stop dielectric layer 170 that laterally surround the array of memory cells 101.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A memory device, comprising:
an array of memory cells overlying a substrate and located in a memory array region, each of the memory cells including a vertical stack containing a bottom electrode, a memory element, and a top electrode;
a logic region located outside the memory array region and is free of memory cells;
an etch stop dielectric layer comprising a horizontally-extending portion that continuously extends throughout the memory array region and the logic region and comprising an array of vertically-protruding portions that laterally surround each memory cell in the array of memory cells, wherein each of the vertically-protruding portions includes a respective opening at a topmost region and a respective annular topmost surface that is located within a horizontal plane including top surfaces of the top electrodes; and
metallic cell contact structures contacting a respective subset of the top electrodes and a respective subset of the vertically-protruding portions of the etch stop dielectric layer, wherein the memory device comprises at least one feature selected from:
a first feature that the memory device comprises:
　a first dielectric matrix layer overlying the horizontally-extending portion of the etch stop dielectric layer and laterally surrounding the array of vertically-protruding portions of the etch stop dielectric layer; and
　a second dielectric matrix layer overlying the first dielectric matrix layer and having a bottom surface located within the horizontal plane including the top surfaces of the top electrodes and having a top surface located within a horizontal plane including top surfaces of the metallic cell contact structures;
a second feature that the memory device comprises:
　metal interconnect structures formed in dielectric material layers and located between the etch stop dielectric layer and the substrate; and
　memory-cell-level metal interconnect structures located in the logic region, extending through the horizontally-extending portion of the etch stop dielectric layer, and having top surfaces within a horizontal plane including top surfaces of the metallic cell contact structures, wherein at least one of the memory-cell-level metal interconnect structures comprises an integrated line and via structure that includes a line portion having a planar bottom surface that is located below the horizontal plane including the top surfaces of the top electrodes and includes a via portion that extends through the horizontally-extending portion of the etch stop dielectric layer;
a third feature that the memory device comprises:
　metal interconnect structures formed in dielectric material layers and located between the etch stop dielectric layer and the substrate; and
　an array of bottom electrode connection via structures contacting a respective one of the bottom electrodes of the array of memory cells and contacting a respective one of the metal interconnect structures formed in the dielectric material layers;
a fourth feature, wherein:
　each of the bottom electrodes includes a respective sidewall that contacts the etch stop dielectric layer; and
　the memory device further comprises an array of dielectric spacers that laterally surround, and contact, a respective memory cell in the array of memory cells, wherein each dielectric spacer in the array of dielectric spacers is laterally surrounded by, and is contacted by, a respective sidewall of the etch stop dielectric layer; and
a fifth feature wherein at least one of the metallic cell contact structures comprises a planar bottom surface that contacts a planar top surface of a respective one of the top electrodes and a tapered downward-protruding portion that extends downward below the horizontal plane including the top surfaces of the top electrodes and contacting a tapered outer sidewall of a respective one of the vertically-protruding portions of the etch stop dielectric layer.

2. The memory device of claim 1, wherein the memory device comprises the first feature.

3. The memory device of claim 1, wherein each annular topmost surface of the vertically-protruding portions of the etch stop dielectric layer comprises an inner periphery that coincides with a periphery of one of the top surfaces of the top electrodes.

4. The memory device of claim 3, wherein:
　an outer periphery of each annular topmost surface of the vertically-protruding portions of the etch stop dielectric layer is laterally offset outward from the inner periphery by a uniform lateral offset distance; and
　the outer peripheries and the inner peripheries of the annular topmost surfaces of the vertically-protruding portions of the etch stop dielectric layer are located within the horizontal plane including the top surfaces of the top electrodes.

5. The memory device of claim 1, wherein the memory device comprises the second feature.

6. The memory device of claim 1, wherein the memory device comprises the third feature.

7. The memory device of claim 1, wherein the memory device comprises the fourth feature.

8. The memory device of claim 1, wherein the memory device comprises the fifth feature.

9. A magnetic tunnel junction (MTJ) memory device, comprising:
an array of memory cells overlying a substrate and located in a memory array region, each of the memory cells including a vertical stack containing a bottom electrode, a memory element containing a magnetic tunnel junction, and a top electrode;
a logic region located outside the memory array region and is free of memory cells;
an etch stop dielectric layer that laterally surrounds each memory cell in the array of memory cells and extends into the logic region, wherein vertically-protruding portions of the etch stop dielectric layer comprises a respective annular topmost surface having an inner periphery and an outer periphery that are located within a horizontal plane including top surfaces of the top electrodes; and
metallic cell contact structures contacting a respective subset of the top electrodes and a respective subset of the vertically-protruding portions of the etch stop dielectric layer, wherein the MTJ memory device comprises at least one feature selected from:
a first feature comprising:
　a first dielectric matrix layer overlying the horizontally-extending portion of the etch stop dielectric layer and laterally surrounding the array of vertically-protruding portions of the etch stop dielectric layer; and
　a second dielectric matrix layer overlying the first dielectric matrix layer and having a bottom surface located within the horizontal plane including the top surfaces of the top electrodes and having a top surface located within a horizontal plane including top surfaces of the metallic cell contact structures; and a second feature comprising:
   at least one of the metallic cell contact structures comprises a bottom surface that contacts a top surface of a respective one of the top electrodes and a tapered downward-protruding portion that extends downward below the horizontal plane including the top surfaces of the top electrodes and contacting a tapered outer sidewall of a respective one of the vertically-protruding portions of the etch stop dielectric layer.

10. The MTJ memory device of claim 9, wherein the MTJ memory device comprises the first feature.

11. The MTJ memory device of claim 9, wherein the MTJ memory device comprises the second feature.

12. The MTJ memory device of claim 9, wherein:
each of the magnetic tunnel junctions comprises a vertical stack of a reference magnetization layer, a nonmagnetic tunnel barrier layer, and a free magnetization layer; and
each of the memory cells comprises a selector element disposed on a respective magnetic tunnel junction.

13. MTJ memory device of claim 9, further comprising:
metal interconnect structures formed in dielectric material layers and located between the etch stop dielectric layer and the substrate; and
an array of bottom electrode connection via structures contacting a respective one of the bottom electrodes of the array of memory cells and contacting a respective one of the metal interconnect structures formed in the dielectric material layers.

14. The MTJ memory device of claim 9, wherein:
each of the bottom electrodes includes a respective sidewall that contacts the etch stop dielectric layer; and
the MTJ memory device further comprises an array of dielectric spacers that laterally surround, and contact, a respective memory cell in the array of memory cells, wherein each dielectric spacer in the array of dielectric spacers is laterally surrounded by, and is contacted by, a respective sidewall of the etch stop dielectric layer.

15. A method of forming a memory device, comprising:
forming an array of memory cells over a substrate in a memory array region, each of the memory cells including a vertical stack that comprises a bottom electrode, a memory element, and a top electrode;
forming an etch stop dielectric layer over the array of memory cells, wherein the etch stop dielectric layer comprises a horizontally-extending portion that continuously extends throughout the memory array region and extends into a logic region;
forming a first dielectric matrix layer over the etch stop dielectric layer, wherein a first portion of a top surface of the first dielectric matrix layer in the memory array region has a greater vertical separation distance from the substrate than a second portion of the top surface of the first dielectric matrix layer formed in the logic region;
planarizing the first dielectric matrix layer by performing a chemical mechanical planarization process using top portions of the etch stop dielectric layer that overlie the array of memory cells as planarization stopping structures;
forming a second dielectric matrix layer over the first dielectric matrix layer; and
forming metallic cell contact structures through the second dielectric matrix layer on a respective subset of the top electrodes over vertically protruding portions of the etch stop dielectric layer that laterally surround the array of memory cells.

16. The method of claim 15, further comprising:
physically exposing top surfaces of the top electrodes during, or after, the chemical mechanical planarization process and prior to formation of the second dielectric matrix layer; and
forming cell contact cavities through the second dielectric matrix layer by performing an anisotropic etch process that etches a material of the second dielectric matrix layer selective to a material of the etch stop dielectric layer, wherein the metallic cell contact structures are formed in the cell contact cavities.

17. The method of claim 16, wherein:
a lateral extent of a first cell contact cavity selected from the cell contact cavities is greater than a lateral extent of one of the top electrodes that underlies the first cell contact cavity;
the first cell contact cavity includes a downward-protruding portion that extends below a horizontal plane including the top surfaces of the top electrodes and overlying a tapered portion of the etch stop dielectric layer; and
a first metallic cell contact structure that is formed in the first cell contact cavity comprises a downward-protruding portion contacting the tapered portion of the etch stop dielectric layer.

18. The method of claim 15, further comprising:
forming a sacrificial planarization stopping material layer over the first dielectric matrix layer, wherein the chemical mechanical planarization process uses a portion of the sacrificial planarization stopping material layer in the logic region as an additional planarization stopping structure; and
removing portions of the etch stop dielectric layer that overlie the array of memory cells concurrently with removal of the portion of the sacrificial planarization stopping material layer in the logic region, wherein the second dielectric matrix layer is formed on a top surface of a remaining portion of the first dielectric matrix layer.

19. The method of claim 15, further comprising:
forming metal interconnect structures formed in dielectric material layers over the substrate;
forming an array of bottom electrode connection via structures on a respective one of the metal interconnect structures, wherein the array of memory cells is formed on the array of bottom electrode connection via structures; and
forming an array of dielectric spacers, wherein each dielectric spacer in the array of dielectric spacers laterally surrounds a respective memory cell in the array of memory cells, and wherein the etch stop dielectric layer is formed over, and on, the array of dielectric spacers.

20. The method of claim 15, further comprising forming an integrated line and via structure in the logic region, wherein the integrated line and via structure comprises a line portion having a planar top surface that is located within a horizontal plane including top surfaces of the metallic cell contact structures and a planar bottom surface that is located below a horizontal plane including top surfaces of the top electrodes, and comprises a via portion that extends through the horizontally-extending portion of the etch stop dielectric layer.

* * * * *